United States Patent
Pandey et al.

(10) Patent No.: US 10,756,093 B1
(45) Date of Patent: Aug. 25, 2020

(54) METHODS OF FORMING INTEGRATED ASSEMBLIES

(71) Applicant: Micron Technology, Inc., Boise, ID (US)

(72) Inventors: Deepak Chandra Pandey, Uttarakhand (IN); Kamal M. Karda, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/294,792

(22) Filed: Mar. 6, 2019

(51) Int. Cl.
| | |
|---|---|
| H01L 27/108 | (2006.01) |
| H01L 25/18 | (2006.01) |
| H01L 29/417 | (2006.01) |
| G11C 11/407 | (2006.01) |

(52) U.S. Cl.
CPC .. *H01L 27/10888* (2013.01); *H01L 27/10808* (2013.01); *H01L 27/10823* (2013.01); *H01L 27/10876* (2013.01); *H01L 27/10885* (2013.01); *H01L 27/10891* (2013.01); *G11C 11/407* (2013.01); *H01L 25/18* (2013.01); *H01L 29/41766* (2013.01)

(58) Field of Classification Search
CPC ......... H01L 21/76805; H01L 21/76831; H01L 27/10814; H01L 27/10826; H01L 27/10855; H01L 27/10885

USPC ........................................................ 438/381
See application file for complete search history.

(56) References Cited

U.S. PATENT DOCUMENTS

| | | | |
|---|---|---|---|
| 2010/0285662 A1* | 11/2010 | Kim | H01L 21/7682 438/675 |
| 2014/0175659 A1* | 6/2014 | Lee | H01L 21/76831 257/773 |
| 2014/0231892 A1* | 8/2014 | Song | H01L 21/76897 257/296 |
| 2015/0262625 A1* | 9/2015 | Han | H01L 21/764 257/773 |
| 2018/0019245 A1* | 1/2018 | Yang | H01L 27/10885 |
| 2019/0181042 A1* | 6/2019 | Xie | H01L 21/321 |

* cited by examiner

*Primary Examiner* — Duy T Nguyen
(74) *Attorney, Agent, or Firm* — Wells St. John P.S.

(57) ABSTRACT

Some embodiments include a method of forming an integrated assembly. Conductive blocks are formed over a construction. Each of the conductive blocks is over a set which includes a pair of storage-element-contact-regions and a digit-line-contact-region. Each of the conductive blocks is entirely laterally surrounded by first insulative material. Central regions of the conductive blocks are removed to split each of the conductive blocks into a first conductive portion over one of the storage-element-contact-regions and a second conductive portion over another of the storage-element-contact-regions. Second insulative material is formed between the first and second conductive portions. Digit-lines are coupled with the digit-line-contact-regions, and storage-elements are coupled with the storage-element-contact-regions.

31 Claims, 40 Drawing Sheets

US 10,756,093 B1

METHODS OF FORMING INTEGRATED ASSEMBLIES

TECHNICAL FIELD

Methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and with digit-lines extending along columns of the array. The wordlines may be coupled with the transistors of the memory cells. Each memory cell may be uniquely addressed through a combination of one of the wordlines with one of the digit-lines.

A continuing goal of integrated circuit fabrication is to achieve ever-increasing levels of integration, and a related goal is to pack circuit components into increasingly tighter arrangements. It is becoming difficult to achieve tighter packing of memory configurations with conventional fabrication processes. Accordingly, it would be desirable to develop new fabrication processes.

BRIEF DESCRIPTION OF THE DRAWINGS

FIG. 1 is a diagrammatic top-down view; FIG. 1C is a diagrammatic cross-sectional top-down view.

FIG. 2 is a diagrammatic top-down view; FIG. 2C is a diagrammatic cross-sectional top-down view.

FIG. 3 is a diagrammatic top-down view; FIG. 3C is a diagrammatic cross-sectional top-down view.

FIG. 4 is a diagrammatic top-down view, and FIGS. 4A and 4B are diagrammatic cross-sectional side views. The view of FIG. 4A is along the lines A-A of FIGS. 4 and 4B. The view of FIG. 4B is along the lines B-B of FIGS. 4 and 4A.

FIG. 5 is a diagrammatic top-down view, and FIGS. 5A and 5B are diagrammatic cross-sectional side views. The view of FIG. 5A is along the lines A-A of FIGS. 5 and 5B. The view of FIG. 5B is along the lines B-B of FIGS. 5 and 5A.

FIG. 6 is a diagrammatic top-down view, and FIGS. 6A and 6B are diagrammatic cross-sectional side views. The view of FIG. 6A is along the lines A-A of FIGS. 6 and 6B. The view of FIG. 6B is along the lines B-B of FIGS. 6 and 6A.

FIG. 7 is a diagrammatic top-down view, and FIGS. 7A and 7B are diagrammatic cross-sectional side views. The view of FIG. 7A is along the lines A-A of FIGS. 7 and 7B. The view of FIG. 7B is along the lines B-B of FIGS. 7 and 7A.

FIG. 8 is a diagrammatic top-down view, and FIGS. 8A and 8B are diagrammatic cross-sectional side views. The view of FIG. 8A is along the lines A-A of FIGS. 8 and 8B. The view of FIG. 8B is along the lines B-B of FIGS. 8 and 8A.

FIG. 9 is a diagrammatic top-down view, and FIGS. 9A and 9B are diagrammatic cross-sectional side views. The view of FIG. 9A is along the lines A-A of FIGS. 9 and 9B. The view of FIG. 9B is along the lines B-B of FIGS. 9 and 9A.

FIG. 11 is a diagrammatic top-down view, and FIGS. 11A and 11B are diagrammatic cross-sectional side views. The view of FIG. 11A is along the lines A-A of FIGS. 11 and 11B. The view of FIG. 11B is along the lines B-B of FIGS. 11 and 11A.

DETAILED DESCRIPTION OF THE ILLUSTRATED EMBODIMENTS

Some embodiments include methods for fabricating memory arrays (e.g., DRAM arrays). Conductive blocks may be configured to extend across sets of contact regions; with each set being associated with a single conductive block, and comprising a digit-line-contact-region between a pair of storage-element-contact-regions (e.g., capacitor-contact-regions). Central regions of the conductive blocks are removed and replaced with insulative material. The insulative material is over the digit-line-contact-regions. Spaced-apart end regions of the conductive blocks remain after the central regions of the conductive blocks are removed. Storage-elements (e.g., capacitors) are coupled to the end regions of the conductive blocks. Interconnects are formed to extend through the insulative material to the digit-line-contact-regions, and digit-lines are formed to be coupled with the interconnects. Example embodiments are described with reference to FIGS. 1-17.

Figure 1:
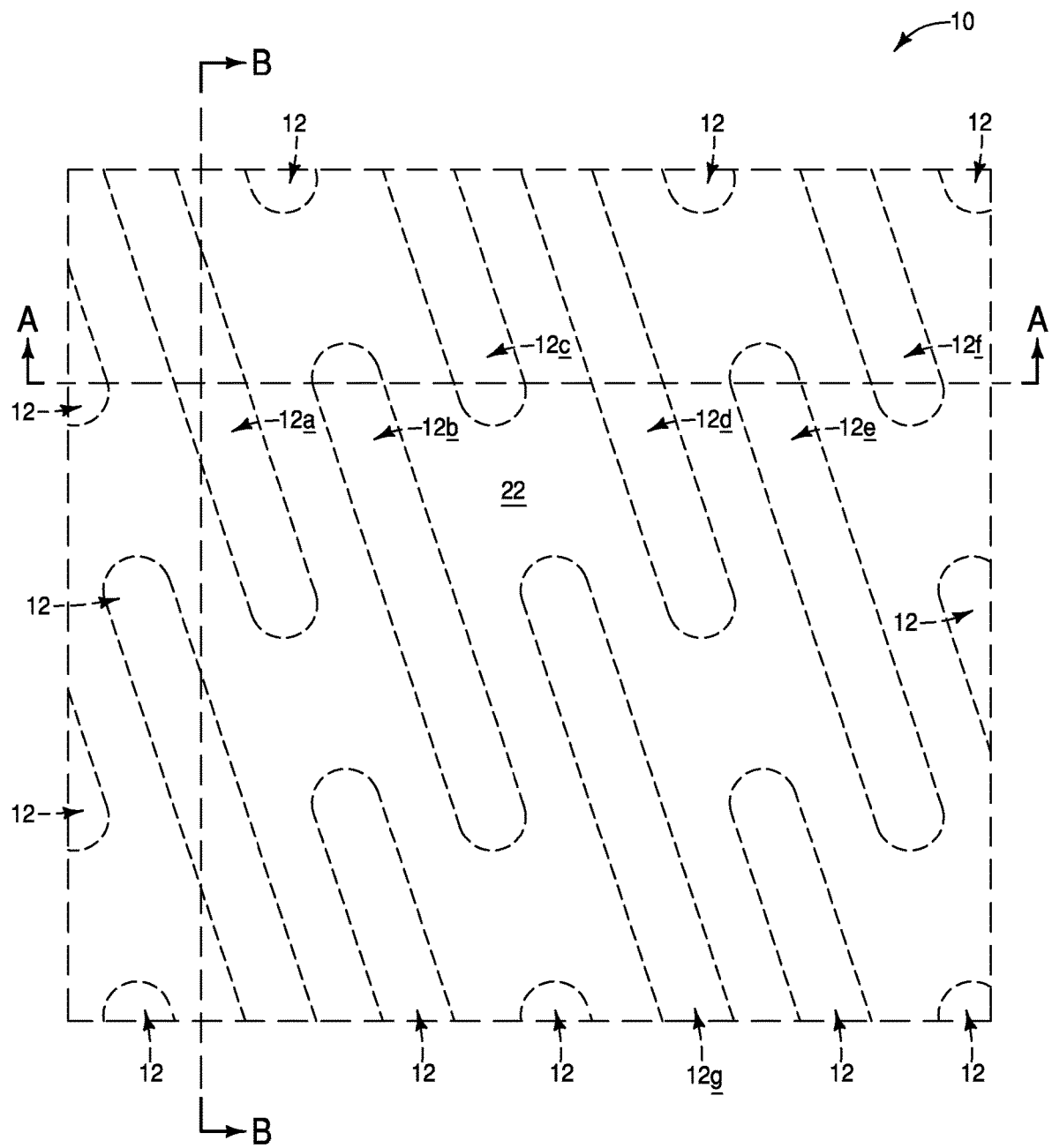
FIGS. 1-1C are diagrammatic views of a region of an example integrated assembly at an initial step of an example method for fabricating an example memory array.
Figure 1A:
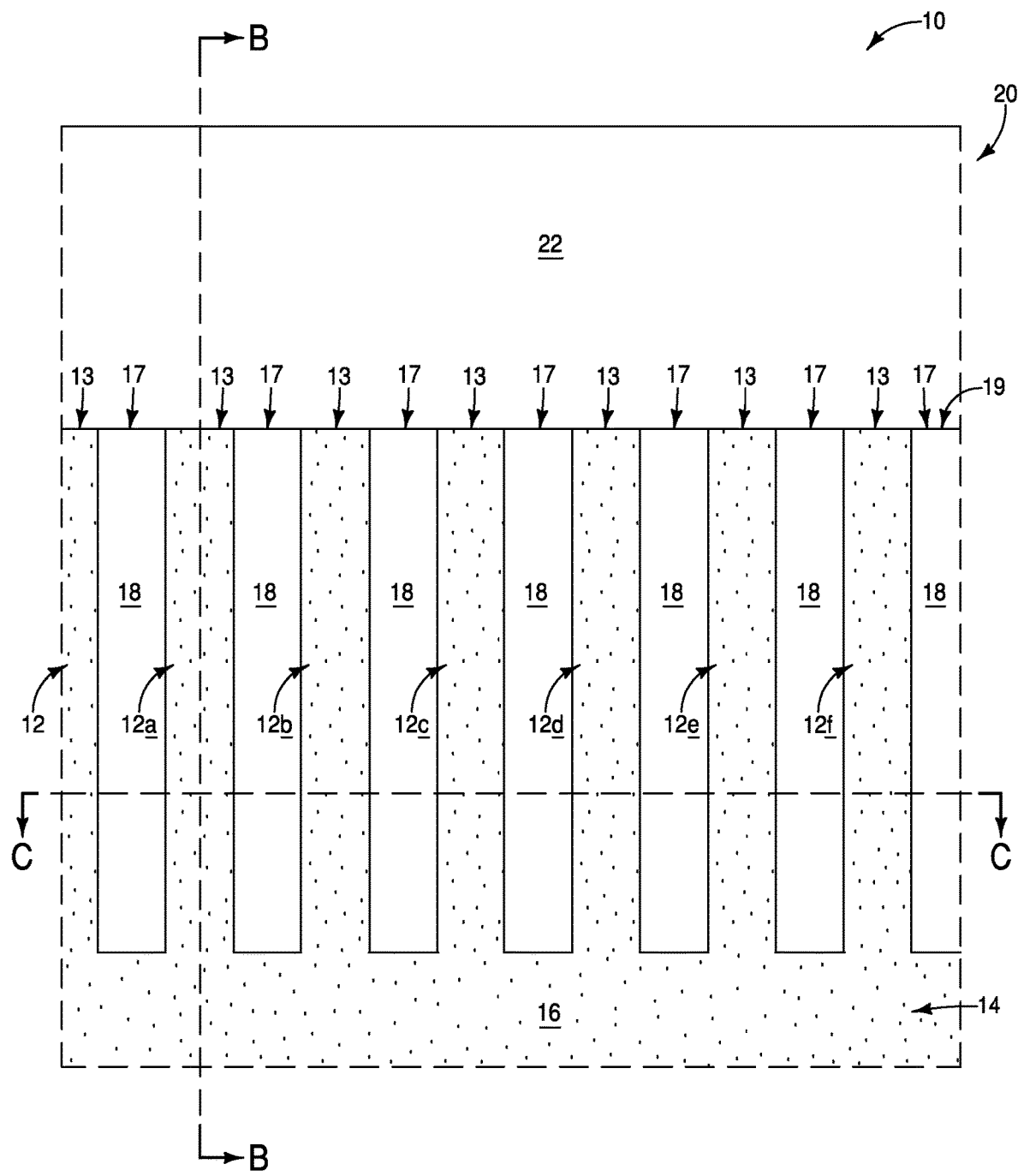
FIGS. 1A and 1B are diagrammatic cross-sectional side views. The view of FIG. 1A is along the lines A-A of FIGS. 1, 1B and 1C. The view of FIG. 1B is along the lines B-B of FIGS. 1, 1A and 1C. The view of FIG. 1C is along the lines C-C of FIGS. 1A and 1B.
Figure 1B:
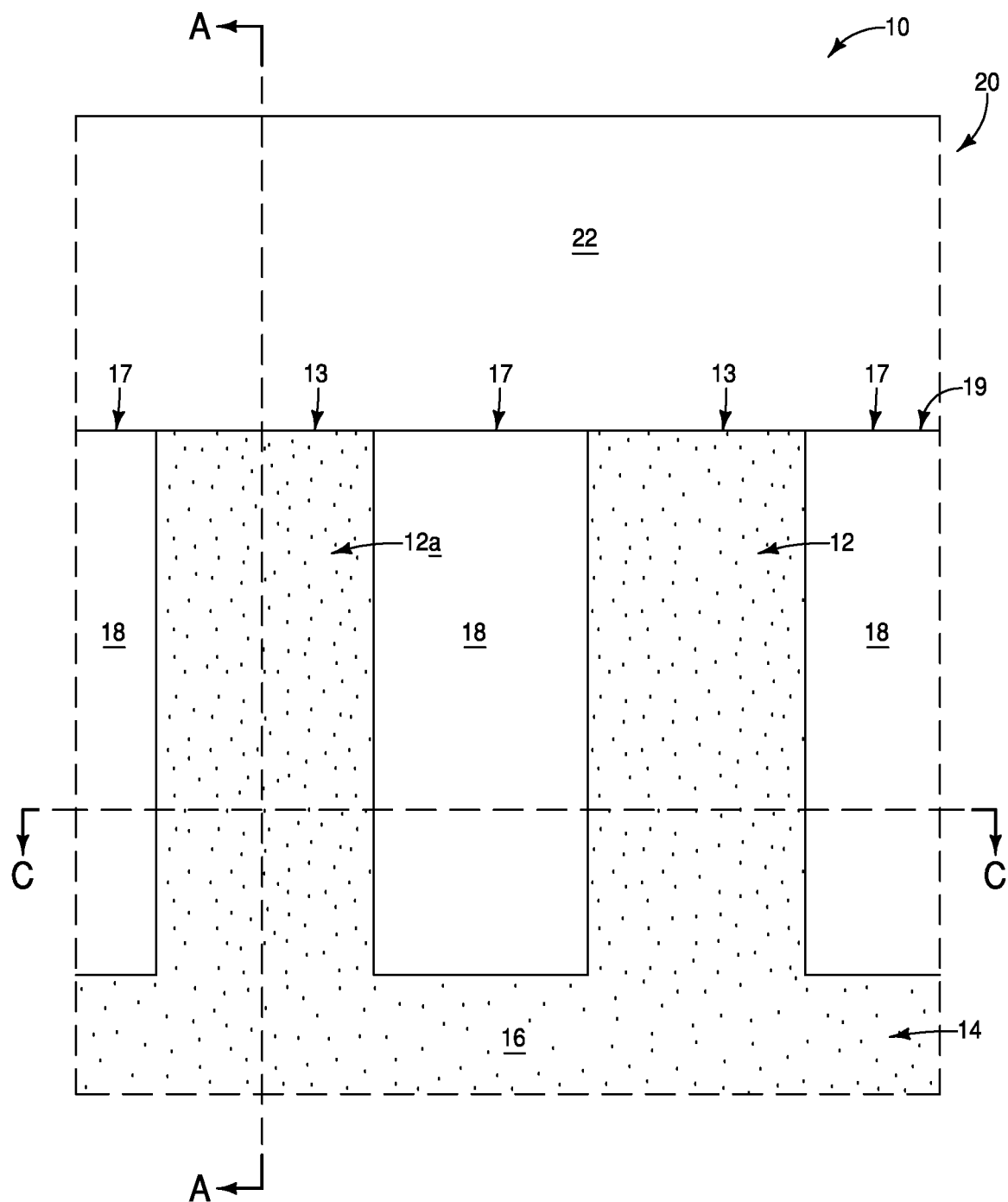
Figure 1C:
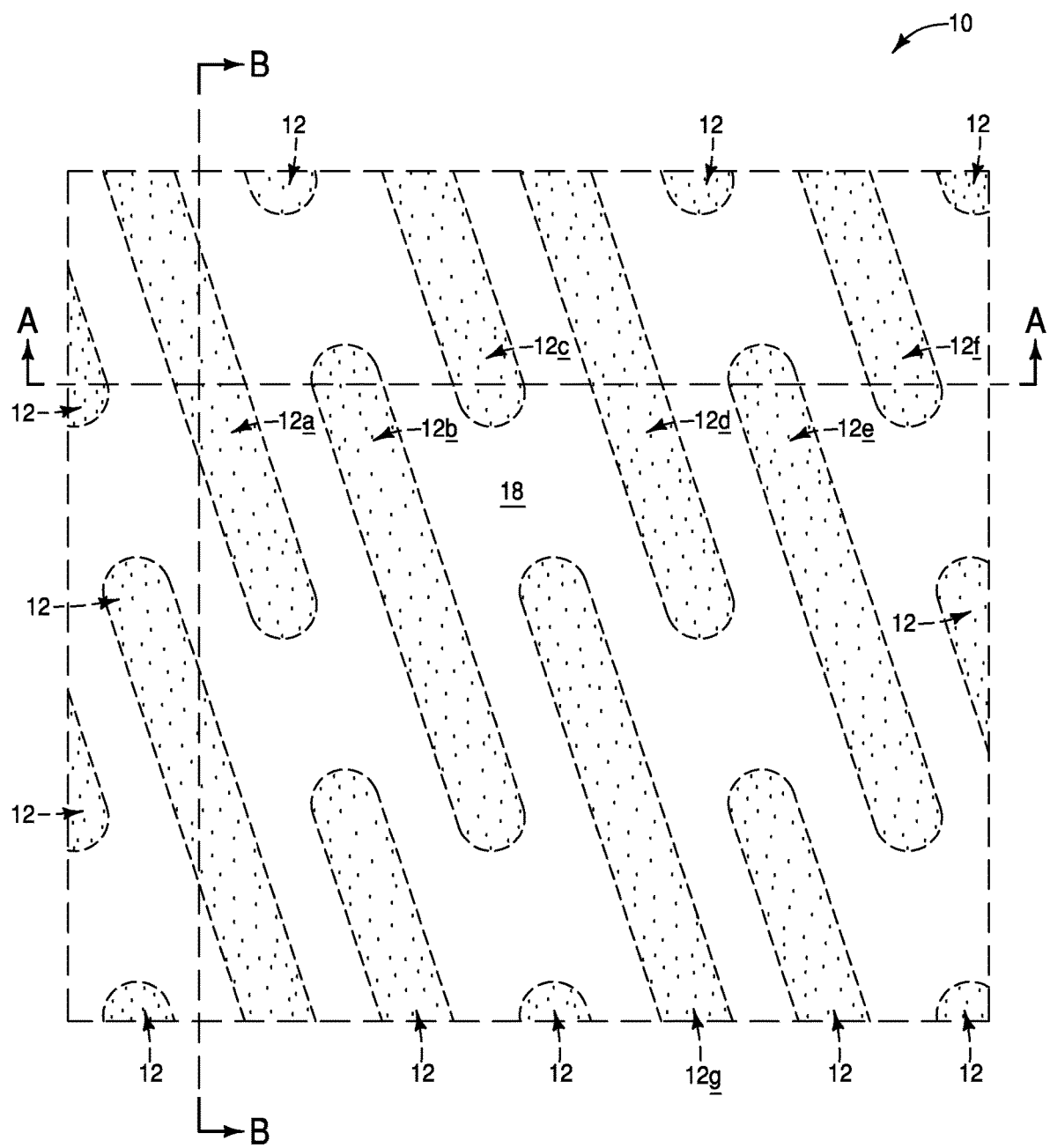

Referring to FIGS. 1-1C, a portion of an example integrated assembly 10 is illustrated. Such assembly may be formed with any suitable methodology. The assembly 10 includes a plurality of active regions 12 (also referred to herein as active-region-pillars) extending upwardly from a semiconductor base 14. Some of the active regions 12 are labeled as 12a-g so that they may be distinguished relative to one another, and relative to others of the active regions. All of the active regions 12 may be substantially identical to one another; with the term "substantially identical" meaning identical to within reasonable tolerances of fabrication and measurement. The active regions 12 are illustrated with dashed lines (phantom view) in FIG. 1 in order to indicate that they are under other materials.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form, and in some embodiments may be monocrystalline silicon. The semiconductor material 16 of the active regions may be referred to as active-region-material.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions comprising insulative-support-material 18. The insulative-support-material 18 may comprise any suitable composition or combination of compositions; and in some embodiments may comprise, consist essentially of, or consist of silicon dioxide. A planarized upper surface 19 extends across the active regions 12 and the insulative-support-material 18. The surface 19 may be formed with any suitable processing, including, for example, chemical-mechanical-processing (CMP). The surface 19 extends across upper surfaces 13 of the active regions 12, and across an upper surface 17 of the insulative-support-material 18.

An expanse 20 is formed over the planarized surface 19. The expanse 20 comprises a material 22. The material 22 may comprise any suitable composition(s); and in some embodiments may comprise one or both of SiON and SiCN, where the chemical formulas indicate primary constituents rather than specific stoichiometries.

Although the expanse 20 is shown to have a uniform composition throughout, it is to be understood that the expanse 20 may comprise two or more discrete compositions in some embodiments.

Figure 2:
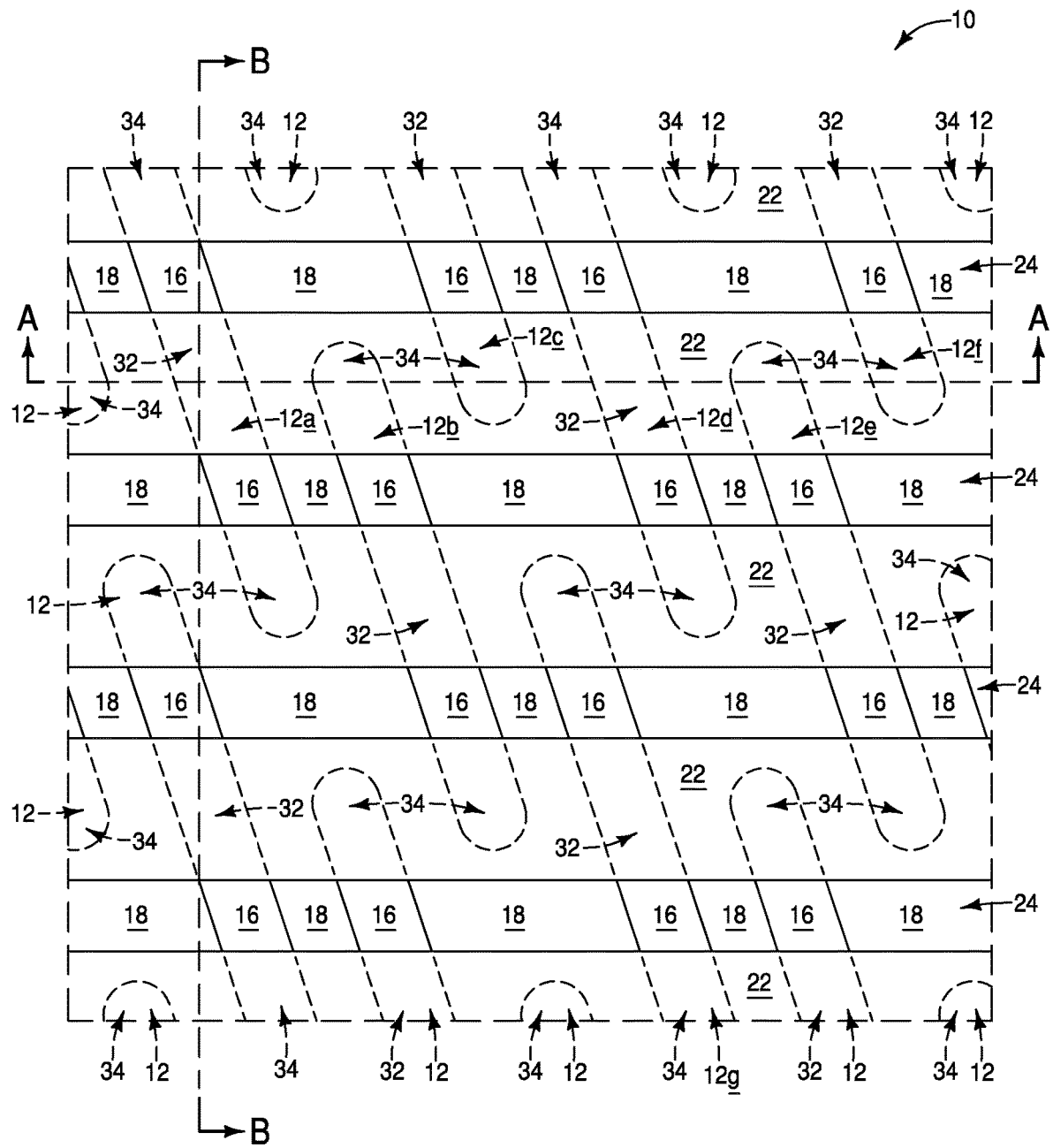
FIGS. 2-2C are diagrammatic views of a region of the example integrated assembly of FIGS. 1-1C shown at an example process step following that of FIGS. 1-1C.
Figure 2A:
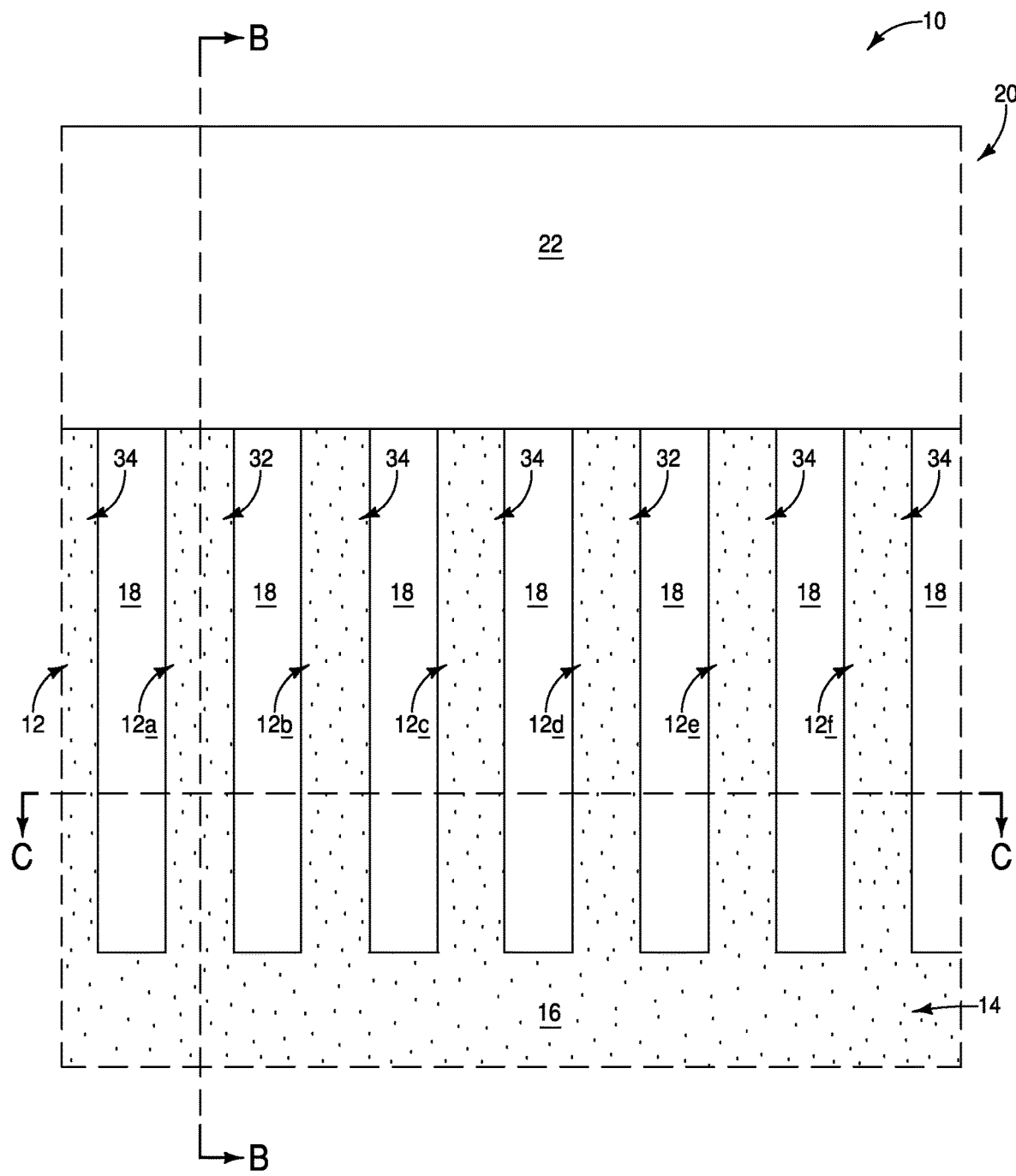
FIGS. 2A and 2B are diagrammatic cross-sectional side views. The view of FIG. 2A is along the lines A-A of FIGS. 2, 2B and 2C. The view of FIG. 2B is along the lines B-B of FIGS. 2, 2A and 2C. The view of FIG. 2C is along the lines C-C of FIGS. 2A and 2B.
Figure 2B:
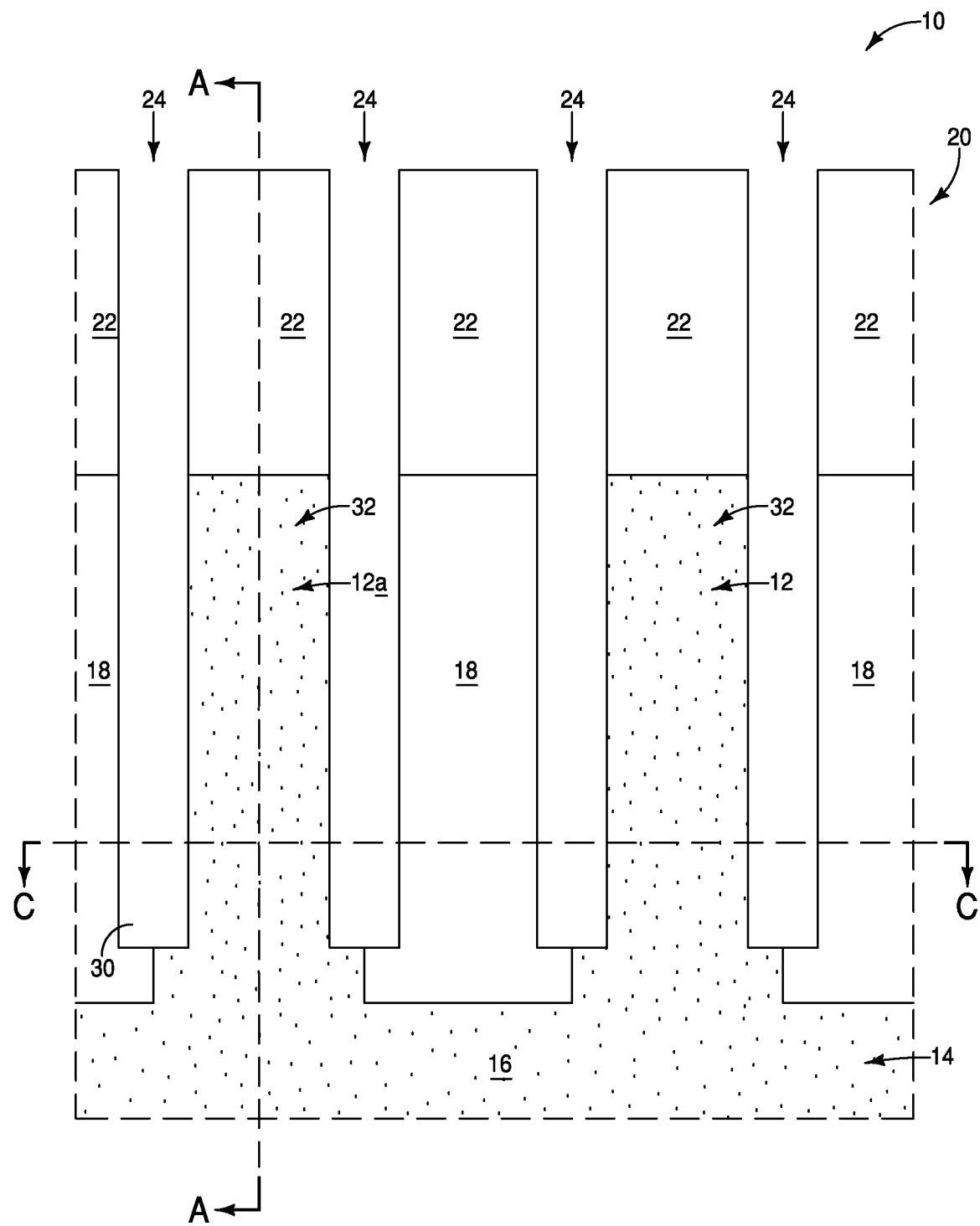
Figure 2C:
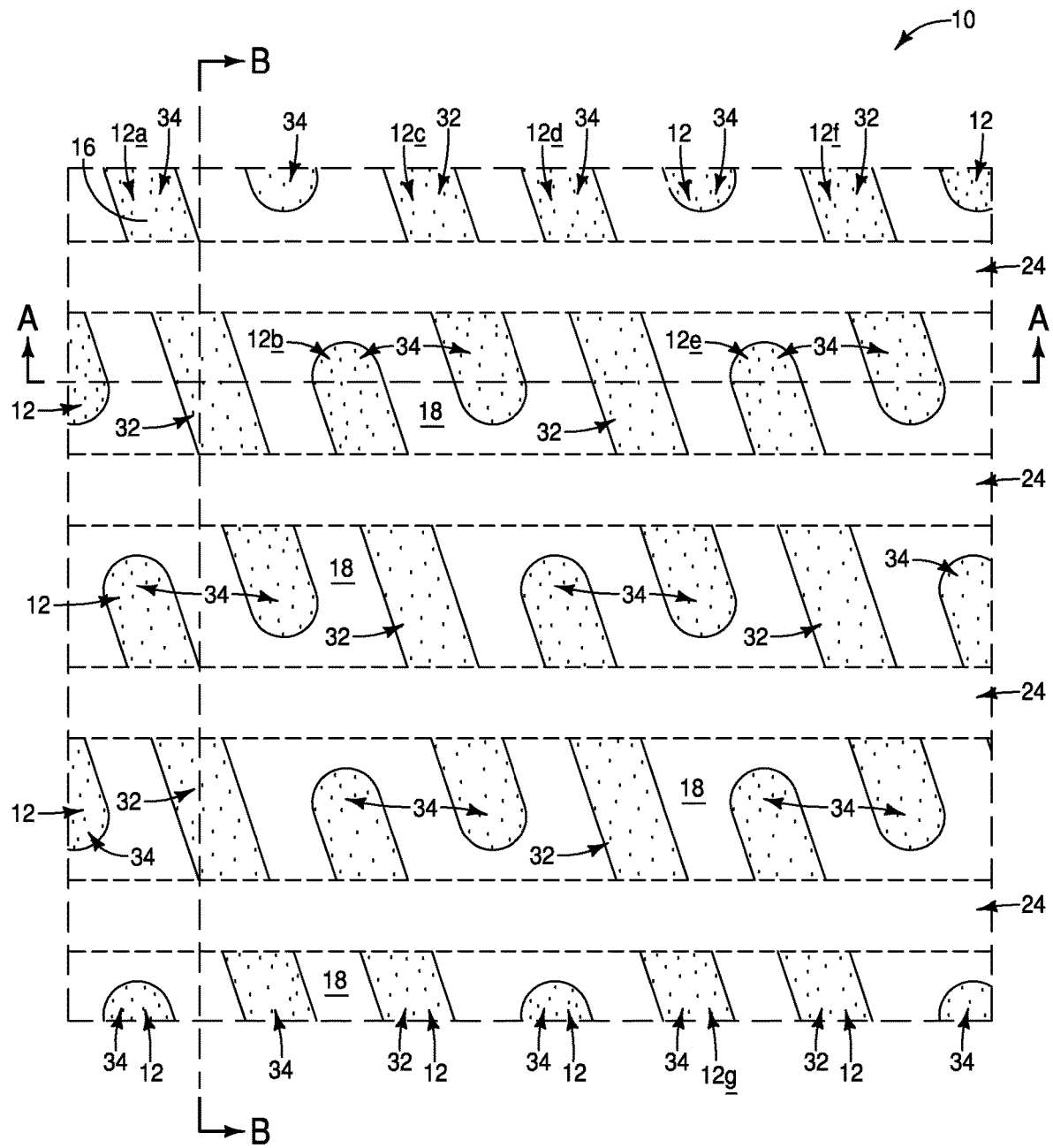

Referring to FIGS. 2-2C, trenches 24 are formed to extend through the expanse 20, and into the materials 16 and 18. The trenches 24 may be formed with any suitable processing. For instance, a photoresist mask (not shown) may be utilized to define locations of the trenches 24, then the trenches may be patterned utilizing one or more suitable etches, and finally the mask may be removed to leave the construction of FIGS. 2-2C.

The trenches extend into the active-region-pillars and subdivide upper portions of each of the pillars into three contact regions. The three contact regions associated with each pillar include two storage-element-contact-regions 34, and include a digit-line-contact-region 32 between the storage-element-contact-regions 34.

Figure 3:
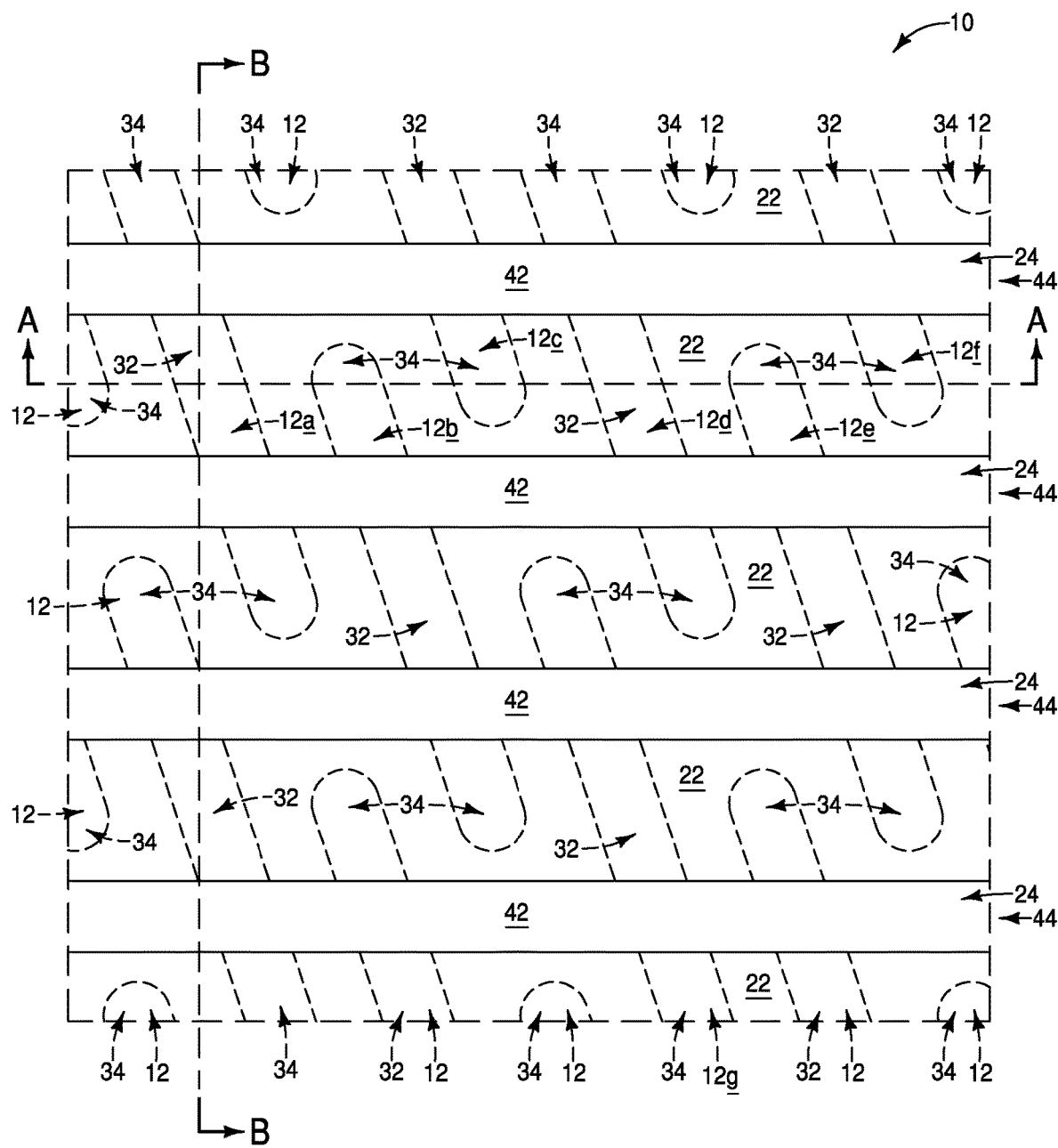
FIGS. 3-3C are diagrammatic views of a region of the example integrated assembly of FIGS. 1-1C shown at an example process step following that of FIGS. 2-2C.
Figure 3A:
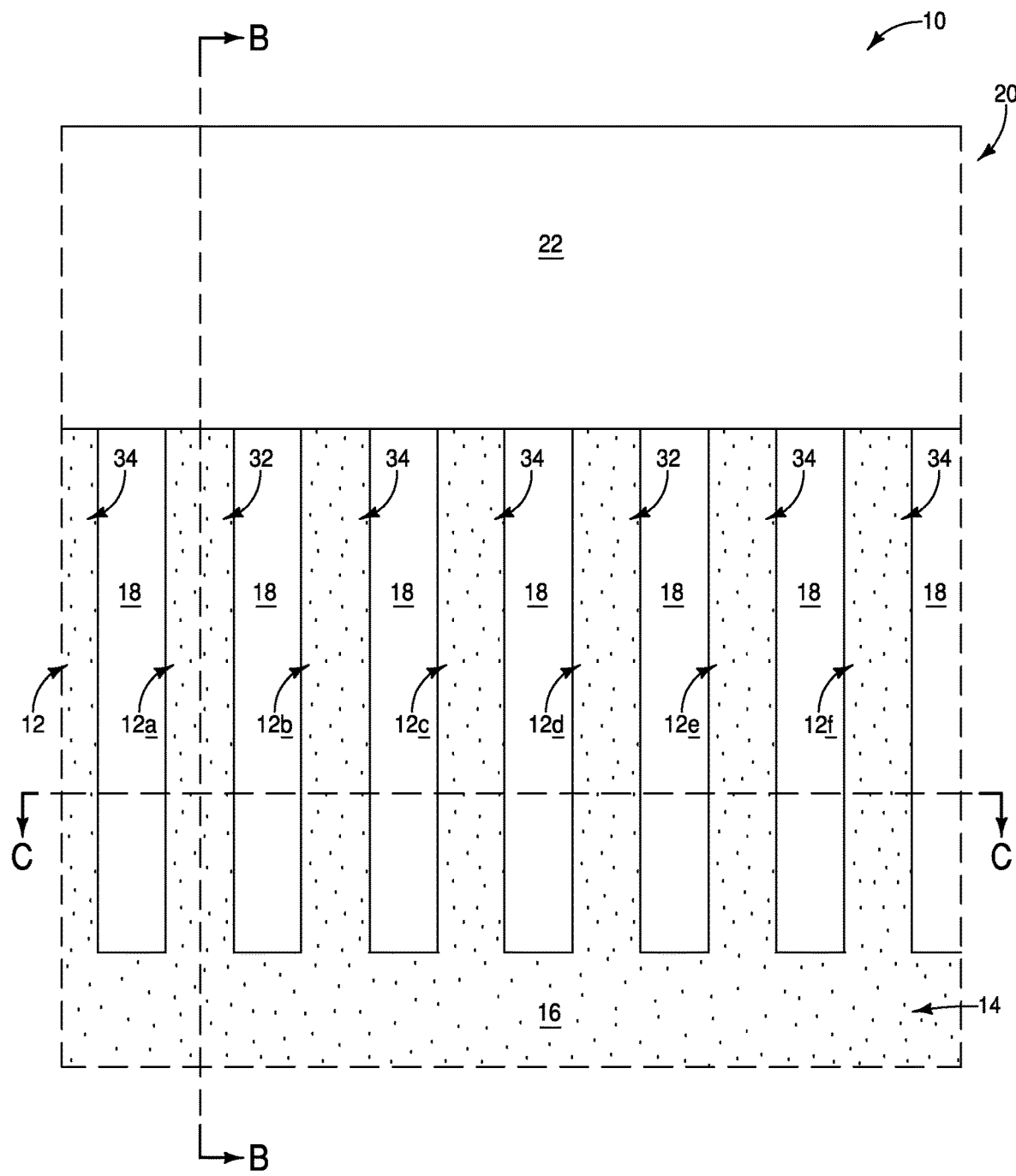
FIGS. 3A and 3B are diagrammatic cross-sectional side views. The view of FIG. 3A is along the lines A-A of FIGS. 3, 3B and 3C. The view of FIG. 3B is along the lines B-B of FIGS. 3, 3A and 3C. The view of FIG. 3C is along the lines C-C of FIGS. 3A and 3B.
Figure 3B:
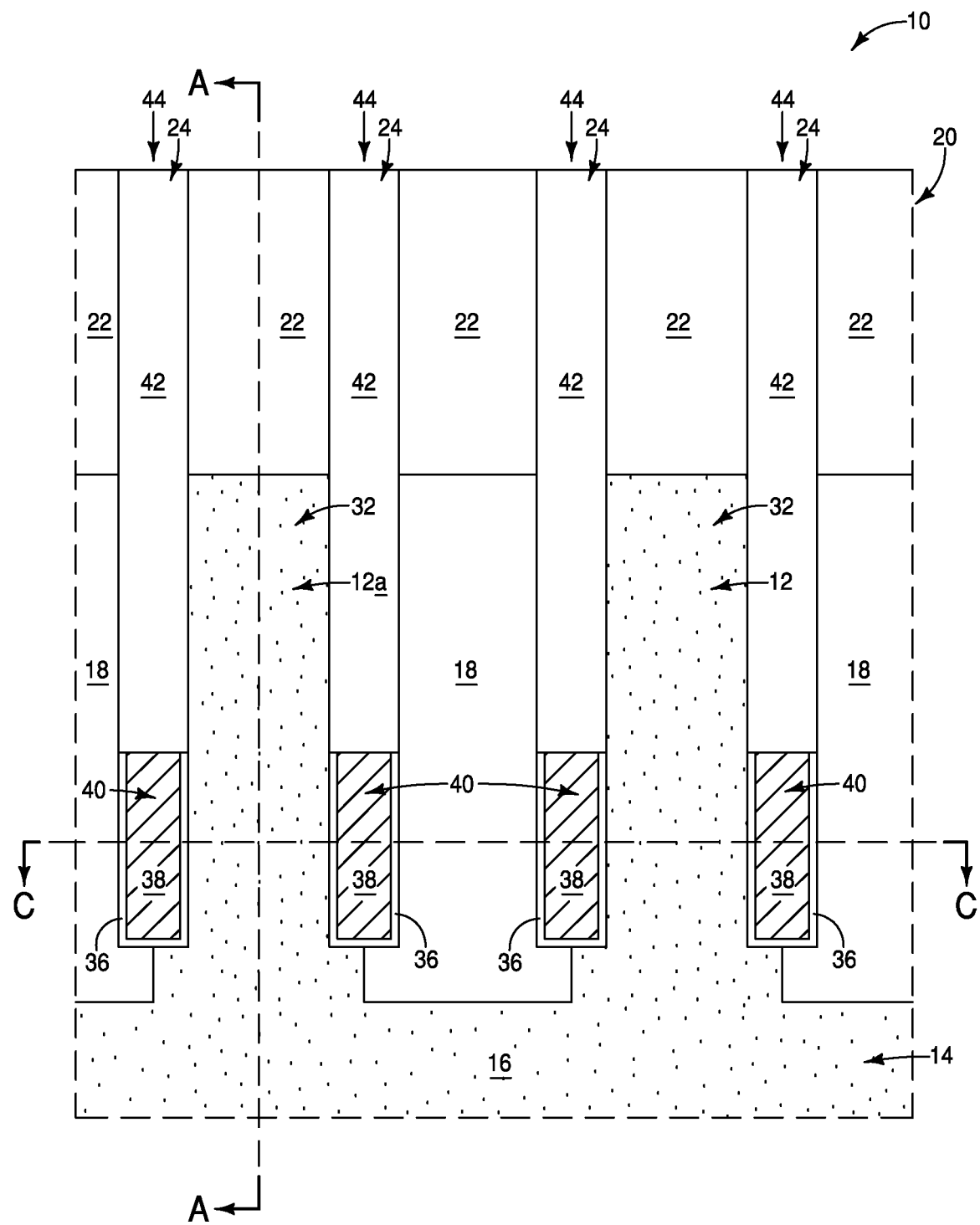
Figure 3C:
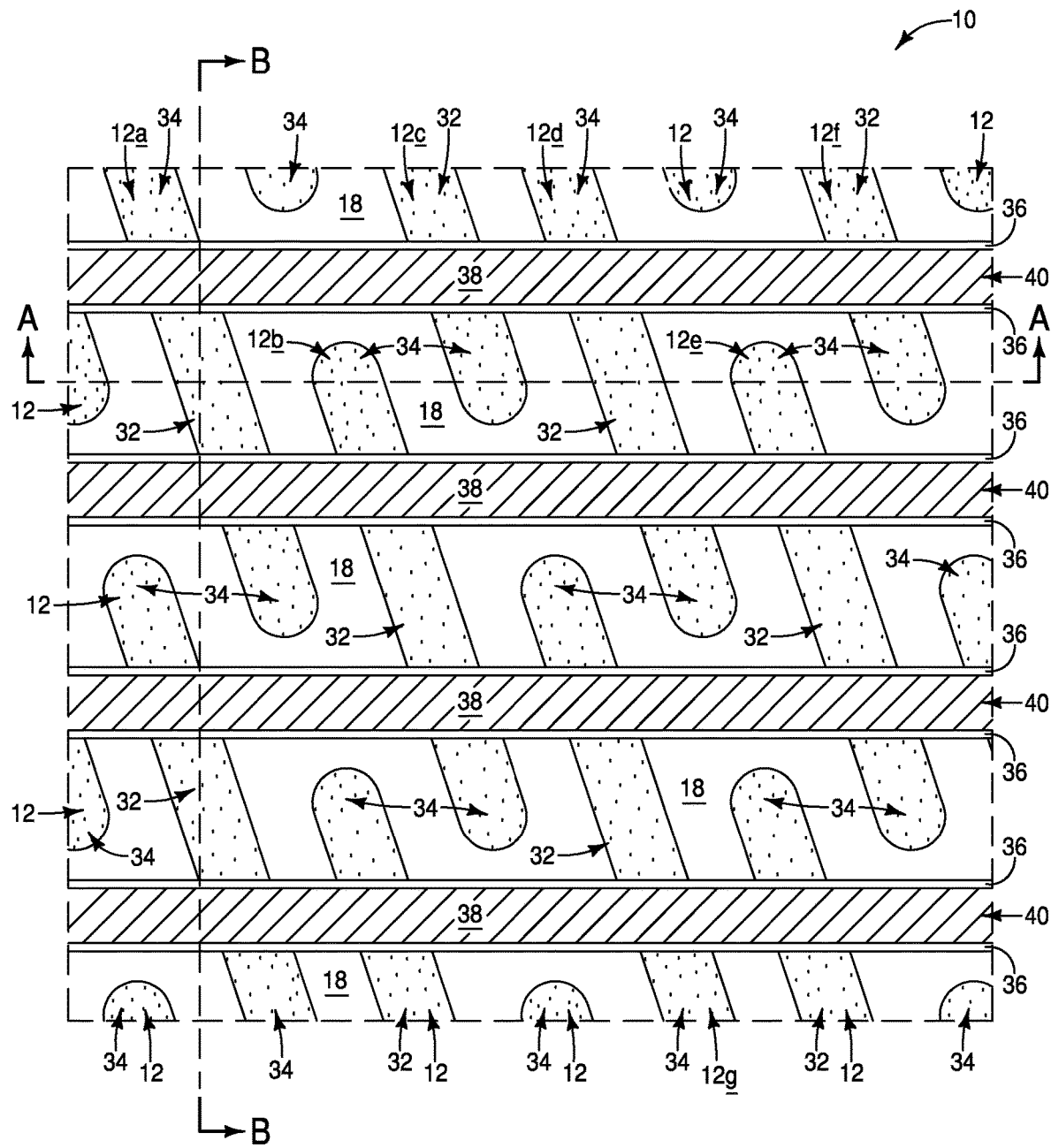
Figure 3C:
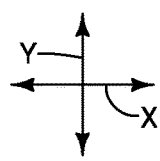

Referring to FIGS. 3-3C, gate dielectric material 36 is provided within bottom regions of the trenches 24, and conductive wordline material 38 is formed over the gate dielectric material 36. The conductive wordline material 38 is configured as wordlines (i.e., access lines) 40 extending along the trenches 24.

The gate dielectric material 36 may comprise any suitable composition(s); and in some embodiments may comprise, consist essentially of, or consist of silicon dioxide.

The wordline material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The wordlines 40 extend along a first direction (represented by an x-axis). The first direction may correspond to a row direction of a memory array.

The wordlines 40 are adjacent to the active-region-pillars 12, and comprise transistor gates along the active regions 12. The transistor gates gatedly couple the storage-element-contact-regions 34 with the digit-line-contact-regions 32.

The trenches 24 are utilized to form the wordlines 40, and in some embodiments the formation of the wordlines 40 may be considered to comprise cutting into the upper portions of the active-region-pillars and thereby subdividing such upper portions into the contact regions 32 and 34.

Insulative material 42 is formed within the trenches 24 and over the wordlines 40. The insulative material 42 within the trenches becomes patterned into rails 44, with such rails extending upwardly from the wordlines 40 and being in one-to-one correspondence with the wordlines 40. The rails 44 extend along the x-axis direction.

The insulative material 42 may comprise any suitable composition(s); and in some embodiments may comprise, consist essentially of, or consist of silicon nitride.

Figure 4:
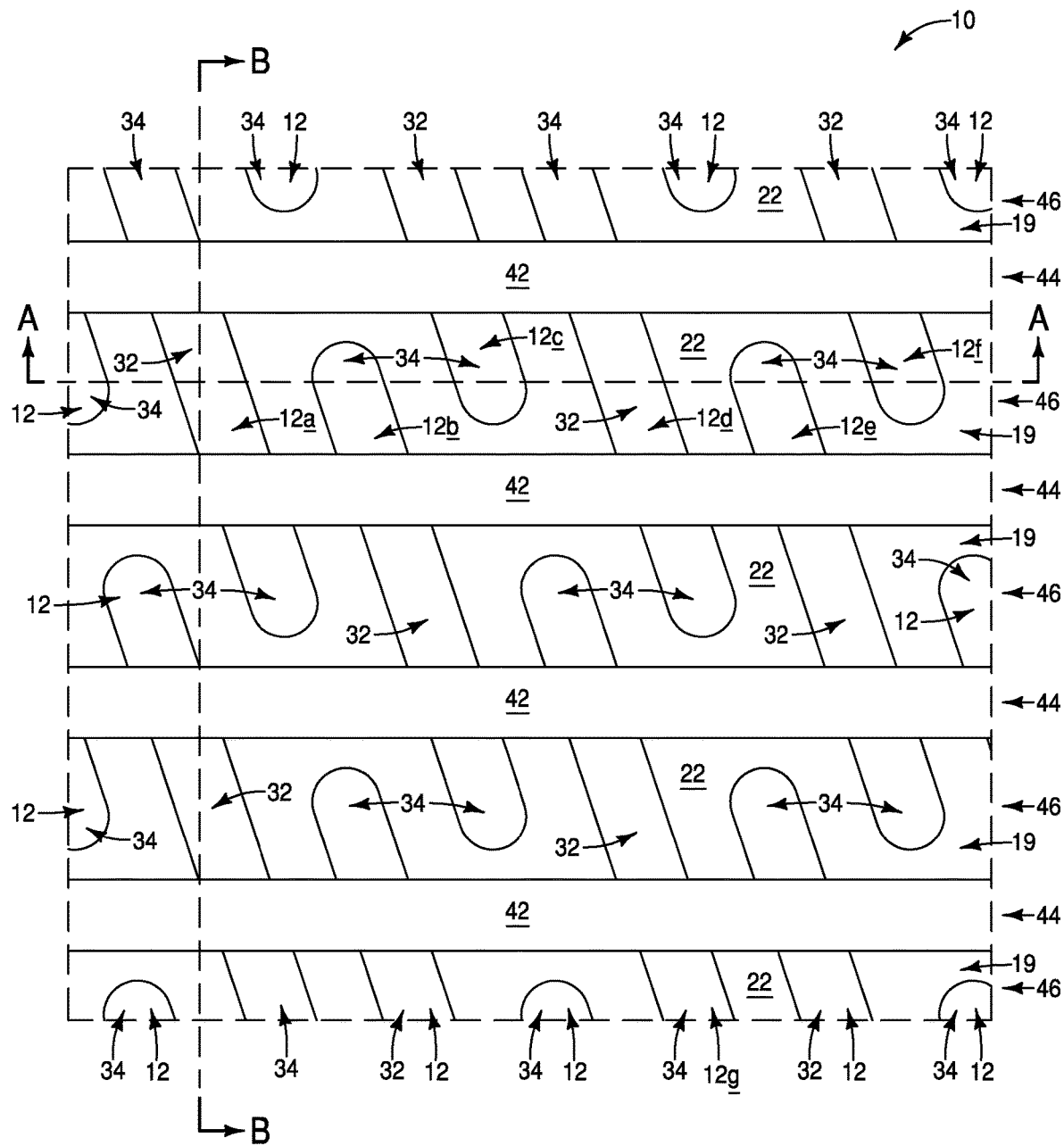
FIGS. 4-4B are diagrammatic views of a region of the example integrated assembly of FIGS. 1-1C shown at an example process step following that of FIGS. 3-3C.
Figure 4A:
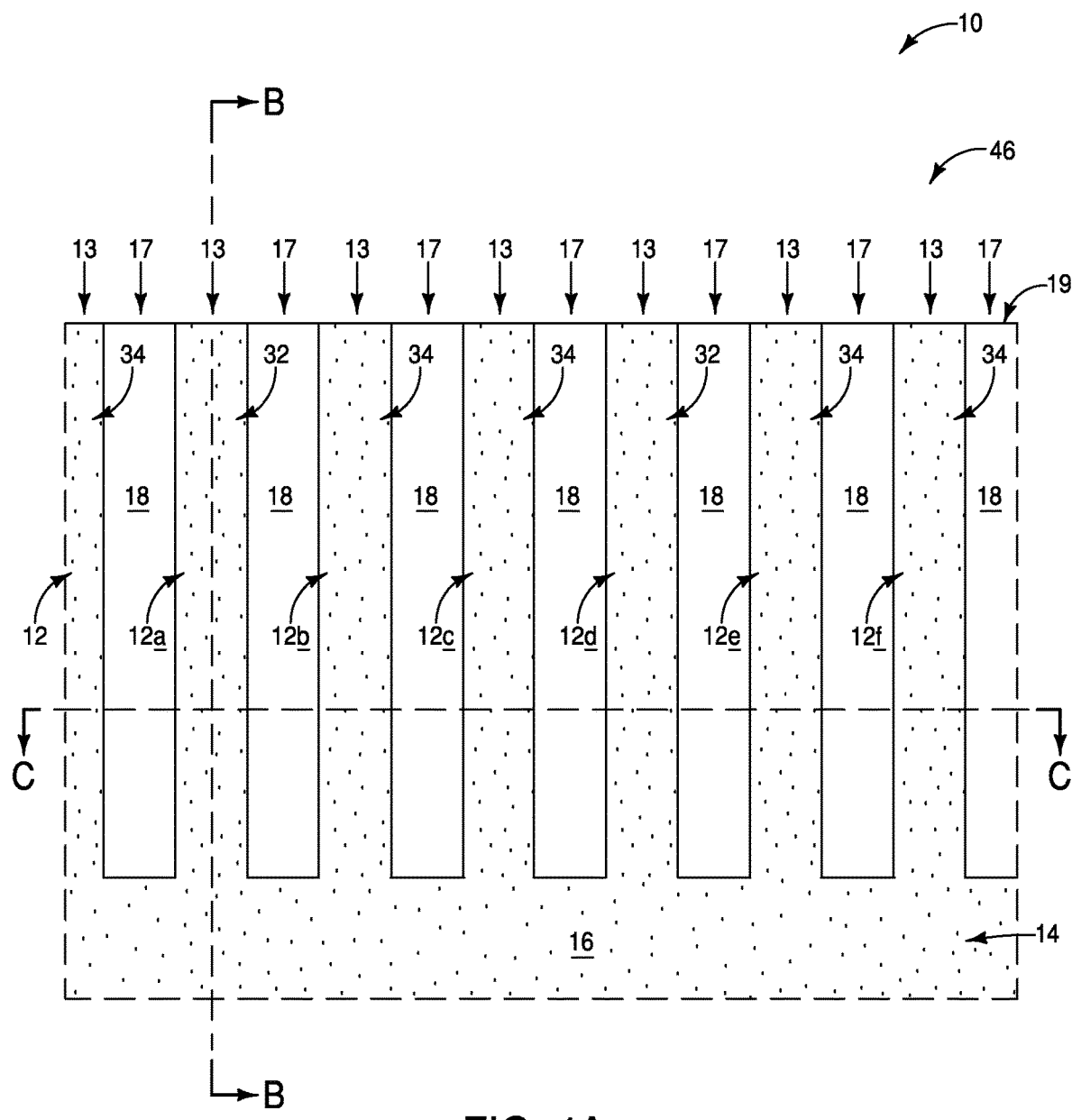
Figure 4B:
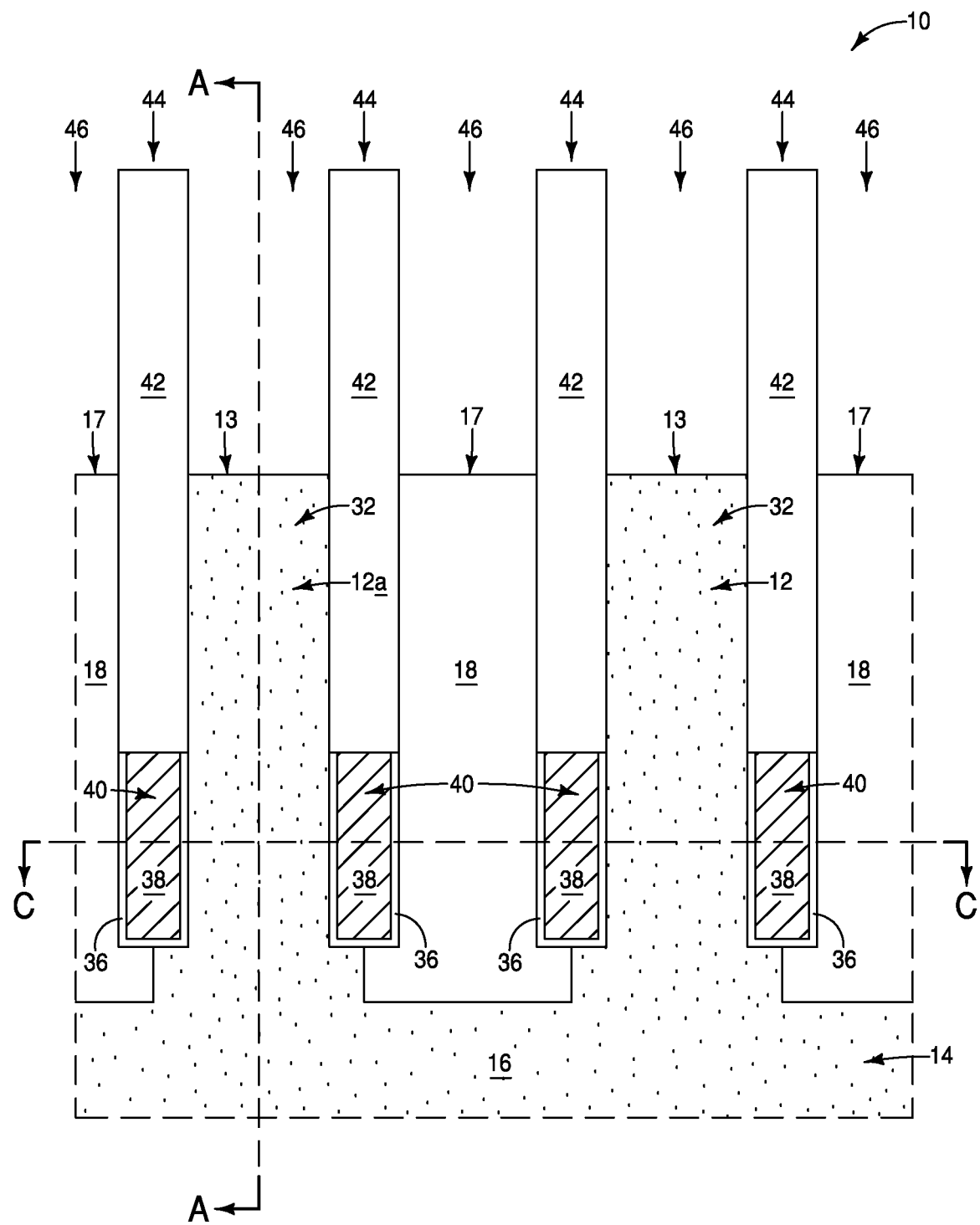

Referring to FIGS. 4-4B, the material 22 (FIGS. 3-3C) is removed to leave intervening gaps 46 between the rails 44. In some embodiments, the rails 44 may be considered to be spaced from one another by the intervening gaps 46 at the processing stage of FIGS. 4-4B.

The upper surface 19 is exposed along bottoms of the intervening gaps 46; with such upper surface including the upper surfaces 13 of the active regions 12, and the upper surface 17 of the insulative-support-material 18. The upper surfaces 13 of the active regions 12 include upper surfaces of the storage-element-contact-regions 34, and upper surfaces of the digit-line-contact-regions 32. In the embodiment of FIGS. 4-4B, the exposed upper surface 19 remains planar along the bottoms of the intervening gaps 46. In other embodiments, one of the materials 18 and 16 may be etched more rapidly than the other so that one of the surfaces 13 and 17 is above the other. Examples of such other embodiments are described below with reference to FIGS. 16 and 17.

Is noted that the view along the cross-section C-C (e.g., the view of FIG. 3C) is not shown relative to the processing stage of FIG. 4, as such view has not changed.

Figure 5:
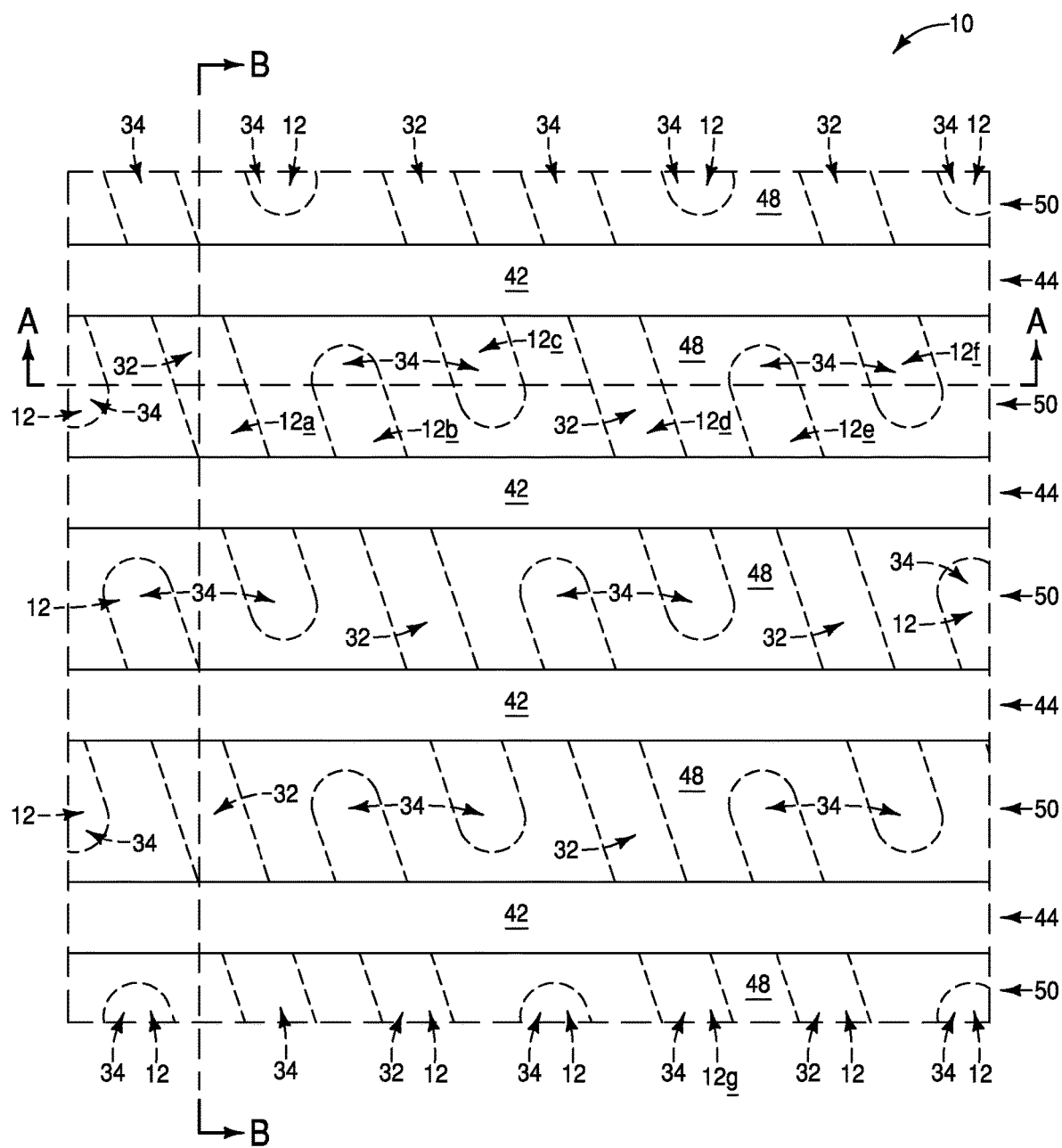
FIGS. 5-5B are diagrammatic views of a region of the example integrated assembly of FIGS. 1-1C shown at an example process step following that of FIGS. 4-4B.
Figure 5A:
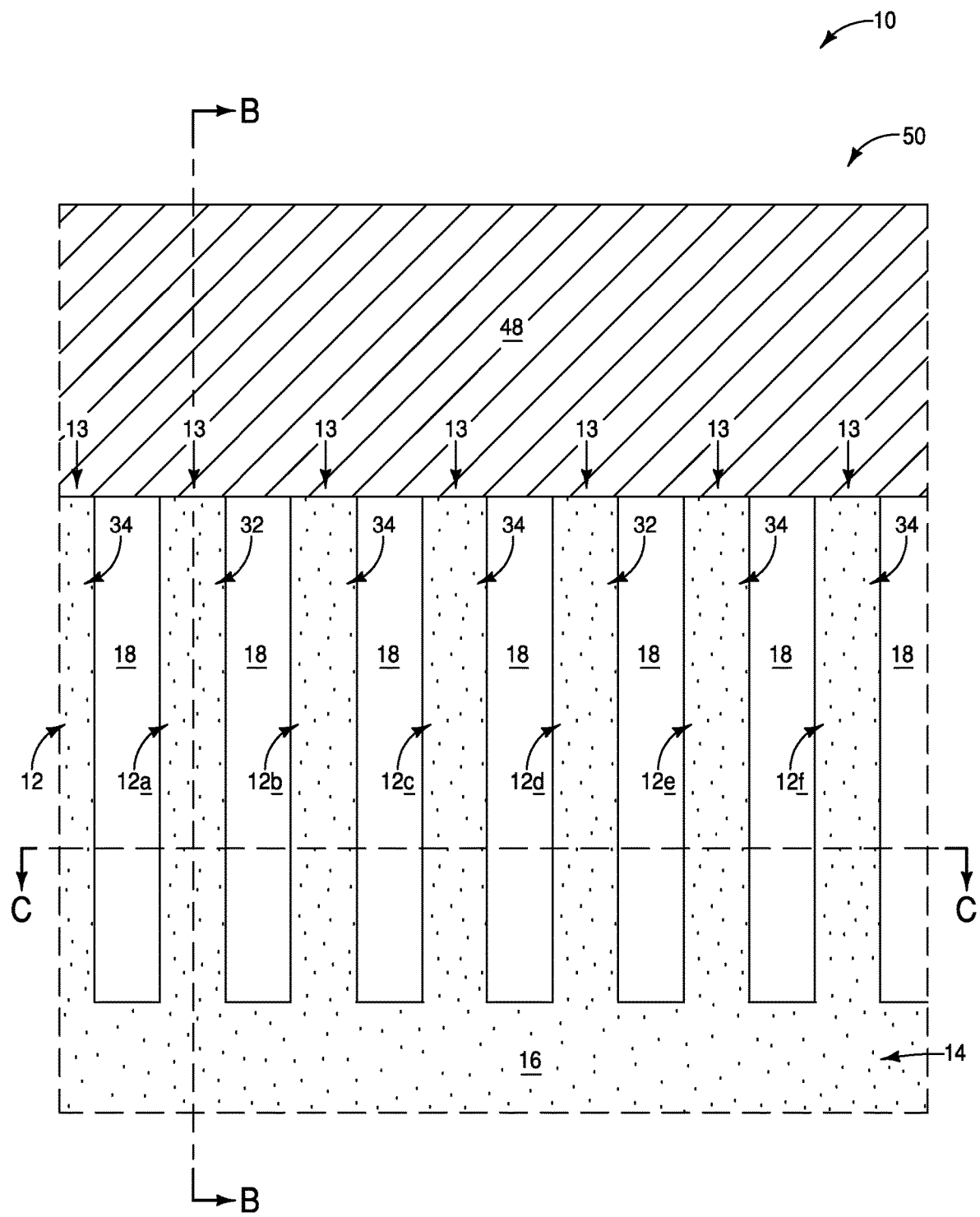
Figure 5B:
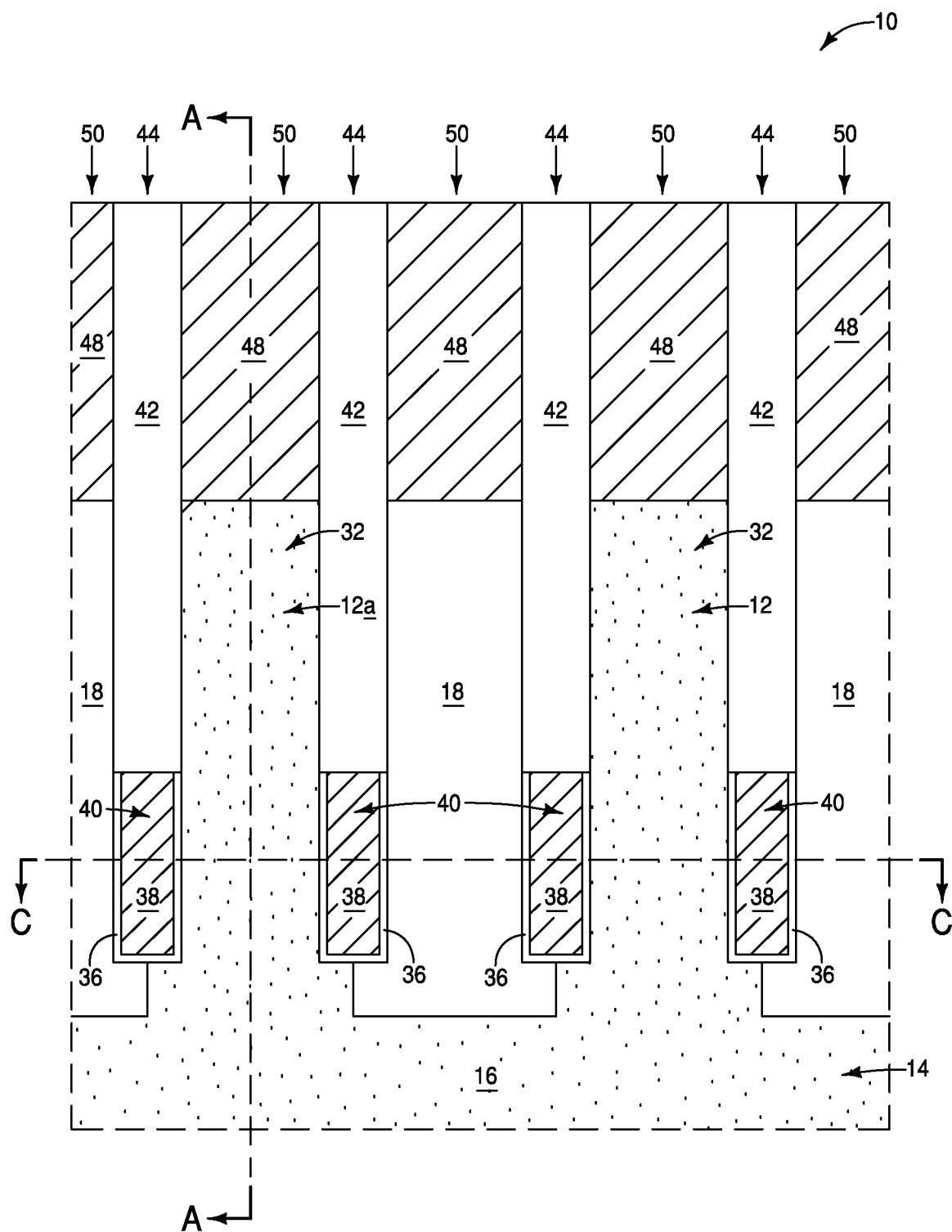

Referring to FIGS. 5-5B, conductive material 48 is formed within the intervening gaps 46 (FIGS. 4-4B). The conductive material is electrically coupled with the storage-element-contact-regions 34 and the digit-line-contact-regions 32; and in the shown embodiment is directly against the upper surfaces 13 of the regions 34 and 32.

The conductive material 48 may be considered to form rails 50 between the rails 44 of the insulative material 42. The rails 50 extend along the same direction as the rails 44, and in some embodiments may be considered to extend along a first direction corresponding to the illustrated x-axis direction. The rails 44 may be referred to as first rails, and the rails 50 may be referred to as second rails. The first and second rails alternate with one another along a second direction (a y-axis direction) which is orthogonal to the first direction.

The conductive material 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 48 may comprise conductively-doped semiconductor material; such as, for example, n-type silicon (e.g., silicon doped to a concentration of at least about $1 \times 10^{20}$ atoms/cm$^3$ with one or more n-type dopants). In some embodiments, the conductive material 48 may comprise metal-containing material; such as, for example, one or more of tungsten, titanium, tungsten nitride, titanium nitride, tungsten silicide, titanium silicide, etc. The conductive material 48 may comprise a single homogeneous composition, as shown, or may comprise multiple discrete compositions. In some embodiments, the conductive material 48 may comprise two or more conductive compositions which are stacked one atop another.

Figure 6:
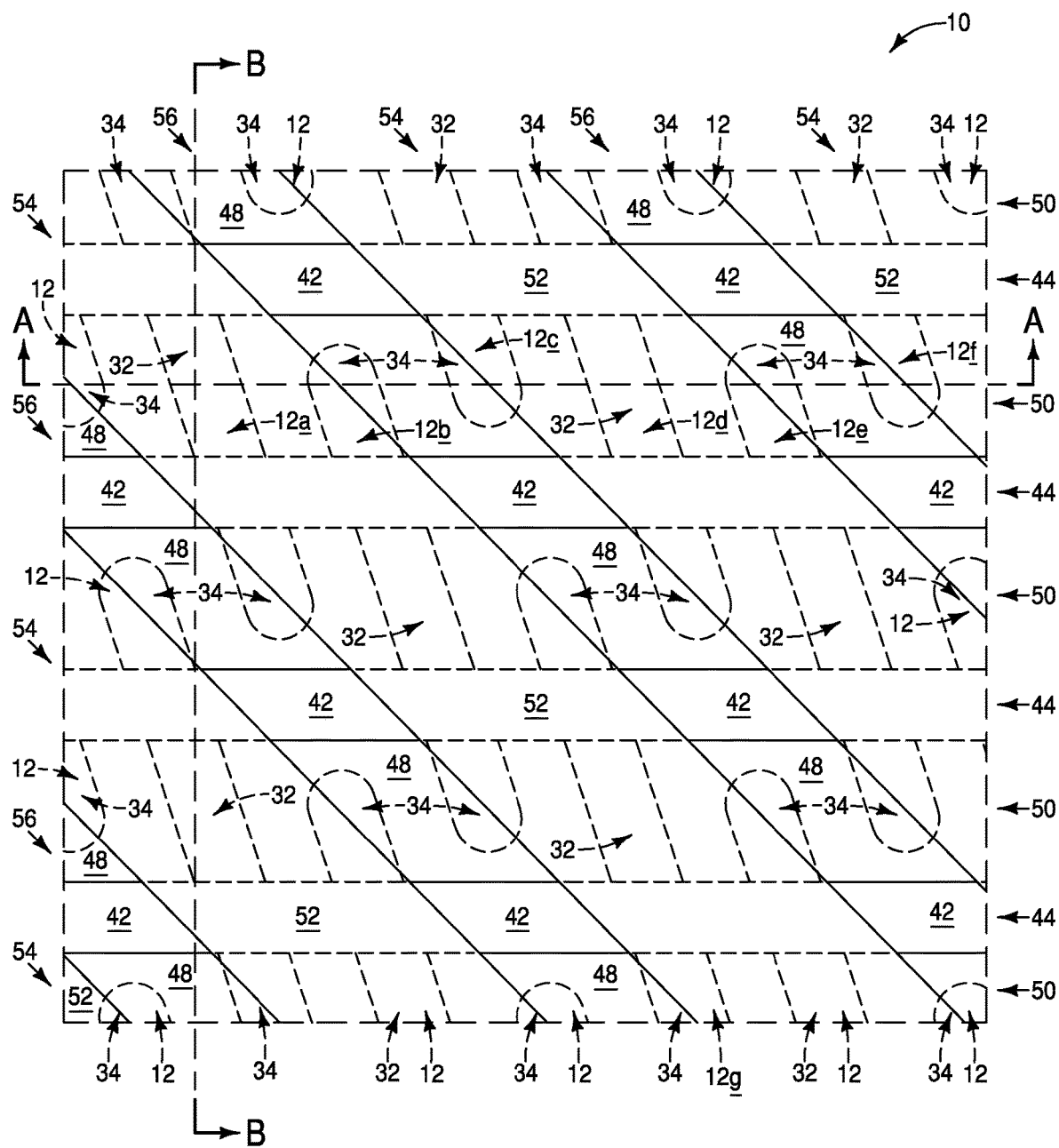
FIGS. 6-6B are diagrammatic views of a region of the example integrated assembly of FIGS. 1-1C shown at an example process step following that of FIGS. 5-5B.
Figure 6A:
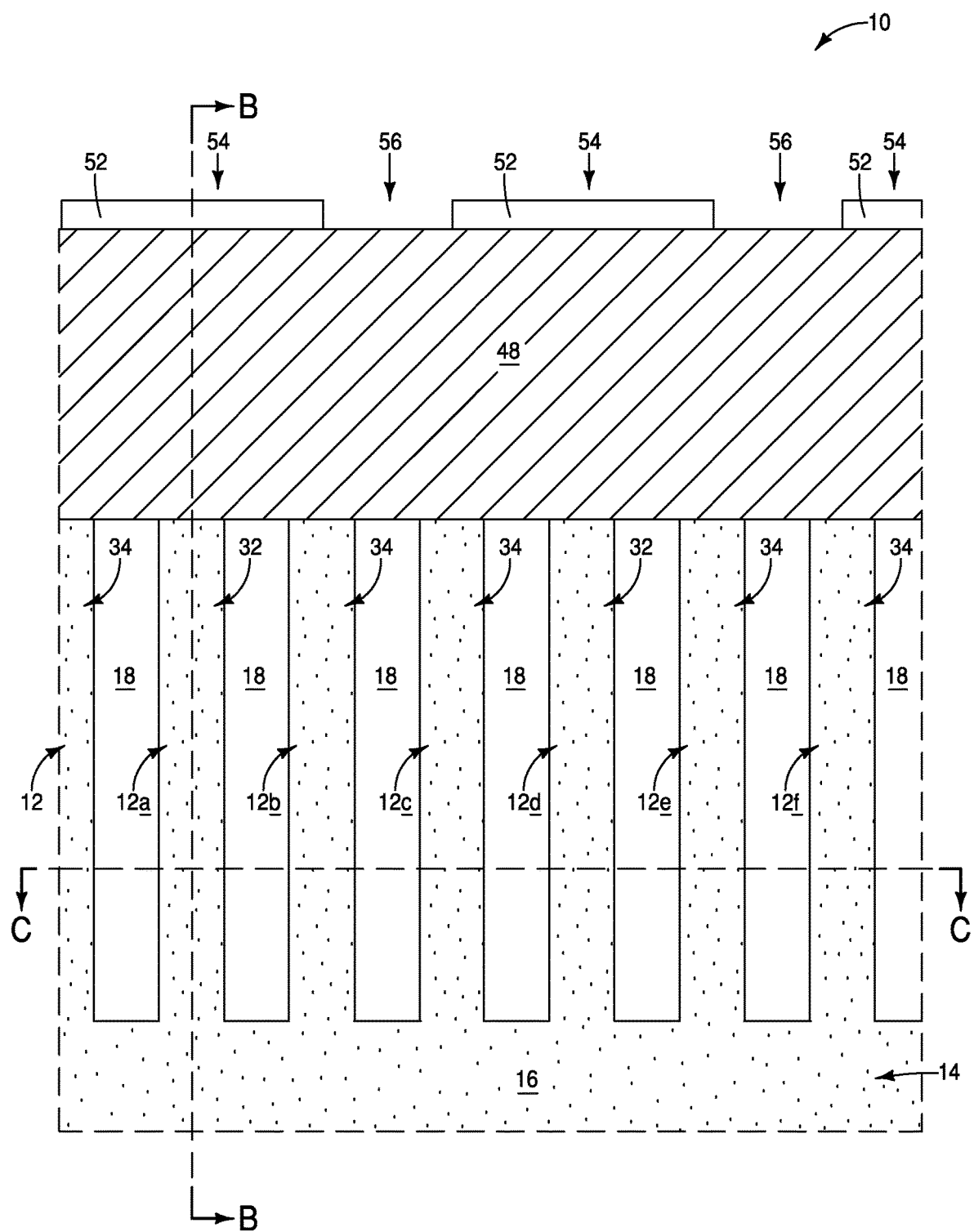
Figure 6B:
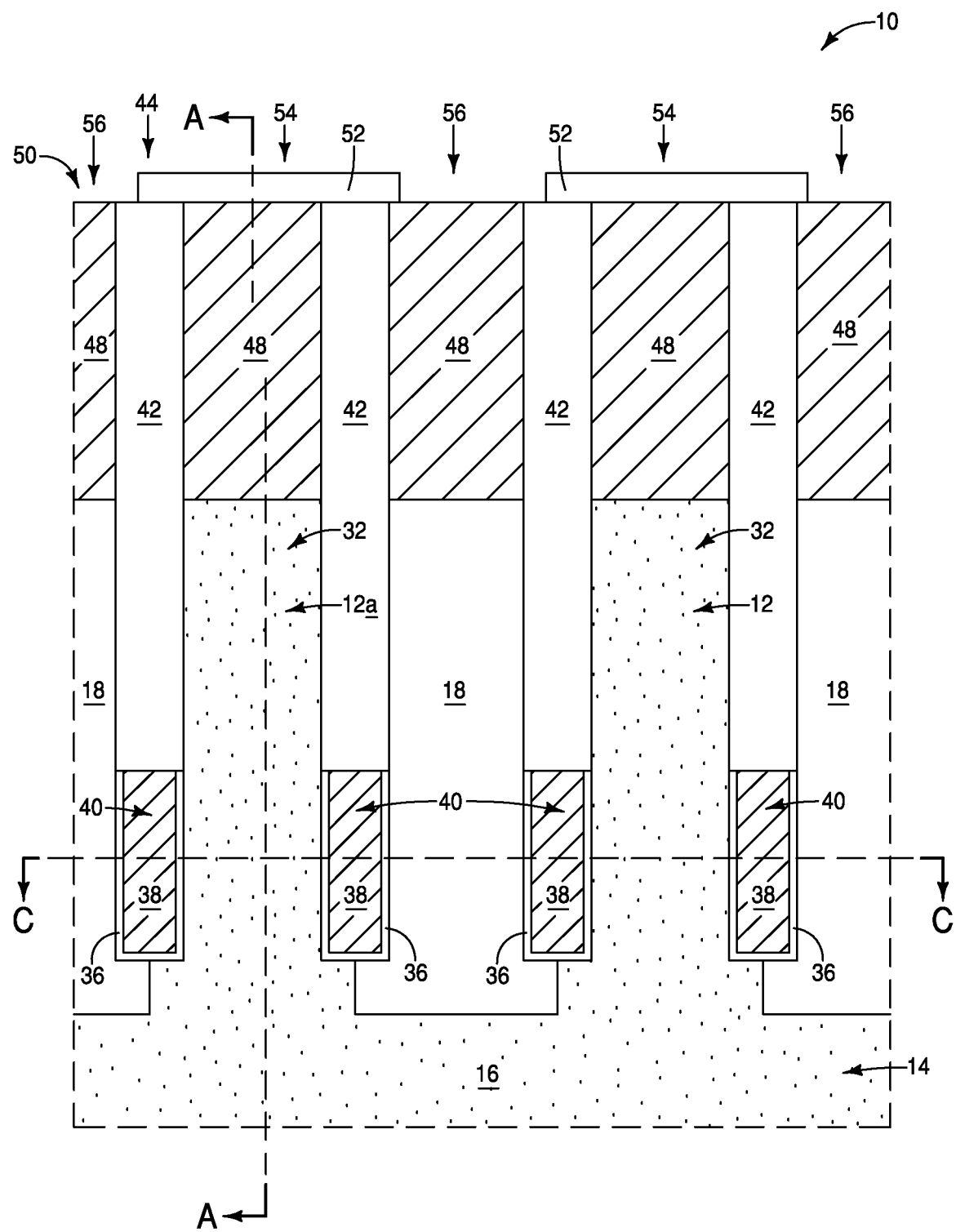

Referring to FIGS. 6-6B, sacrificial material 52 is formed over the rails 44 and 50 (i.e., over the materials 42 and 48), and is patterned into lines 54 which extend along a third direction (an illustrated Q-axis direction) which crosses the first and second directions (the illustrated x-axis and y-axis directions). The lines 54 are spaced from one another by trenches 56, with bottoms of the trenches 56 comprising upper surfaces of the first and second rails 44 and 50.

The sacrificial material 52 may be patterned into the lines 54 with any suitable processing. In some embodiments, a layer of material 52 may be formed across upper surfaces of the rails 44 and 50, then such layer may be patterned utilizing a photolithographically-patterned mask (not shown) and one or more suitable etches, and subsequently the mask may be removed to leave the configuration of FIGS. 6-6B.

The sacrificial material 52 may comprise any suitable composition(s); and in some embodiments may comprise one or more of AlO, SiON and SiCN, where the chemical formulas indicate primary constituents rather than specific stoichiometries.

Figure 7:
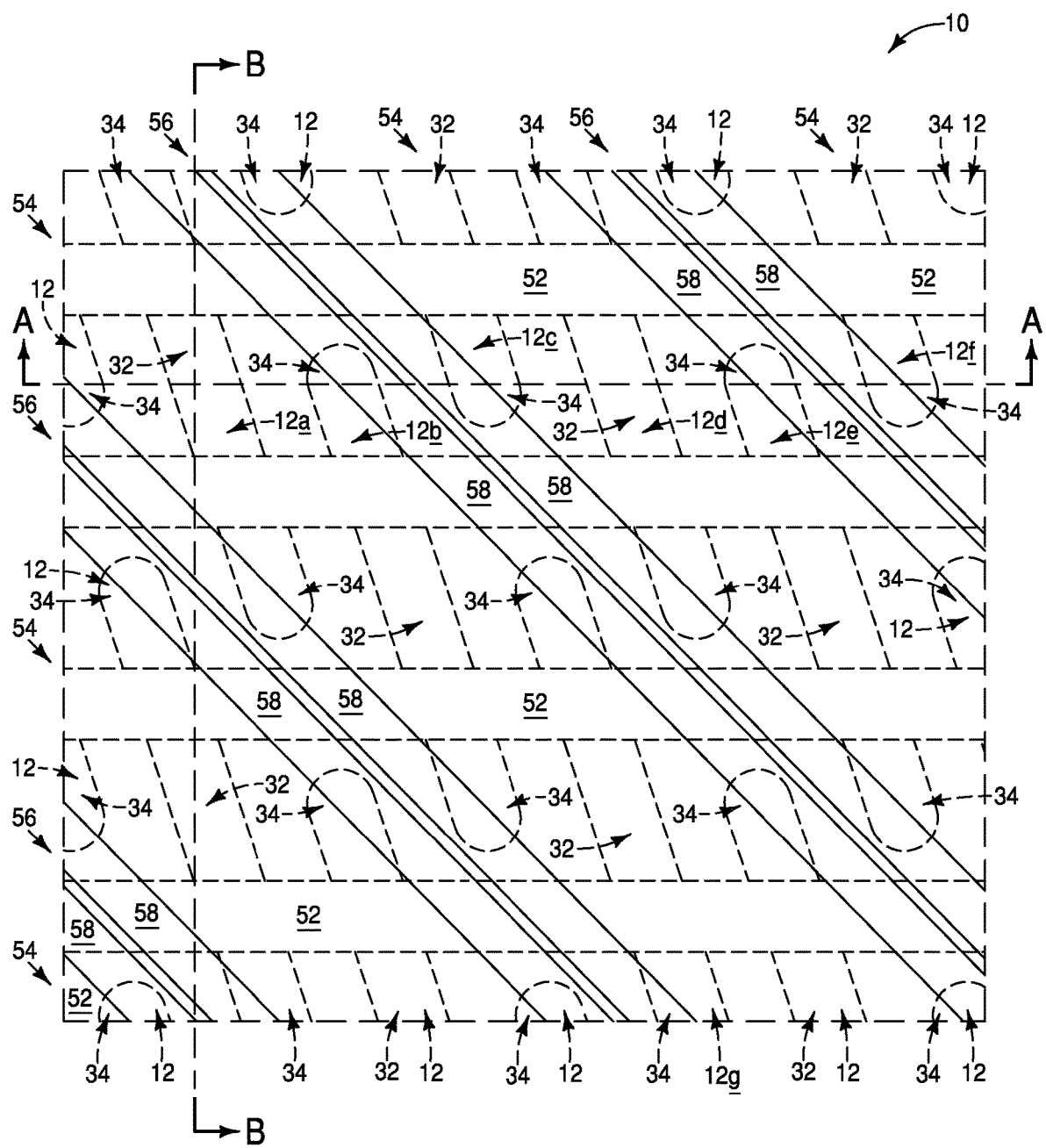
FIGS. 7-7B are diagrammatic views of a region of the example integrated assembly of FIGS. 1-1C shown at an example process step following that of FIGS. 6-6B.
Figure 7A:
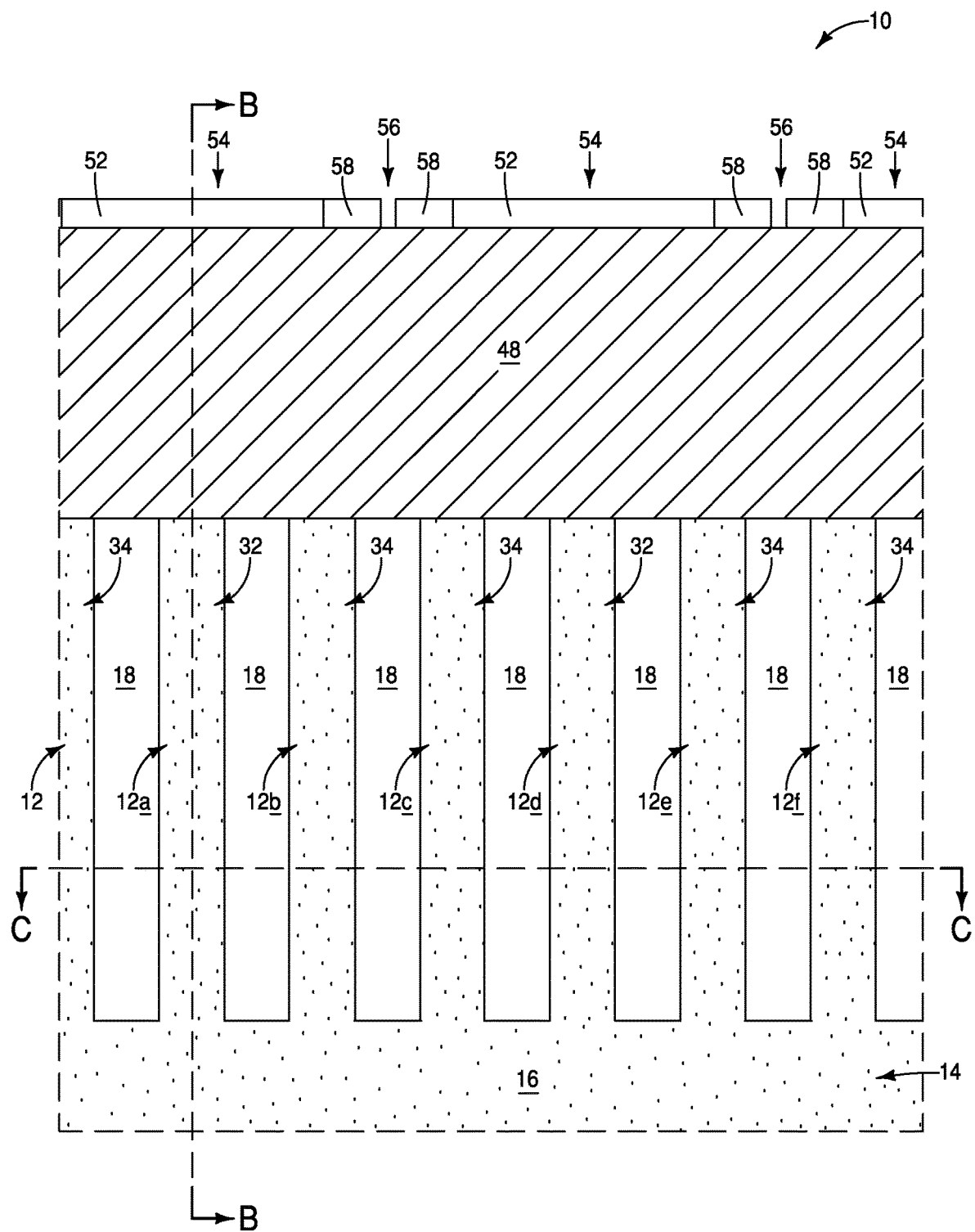
Figure 7B:
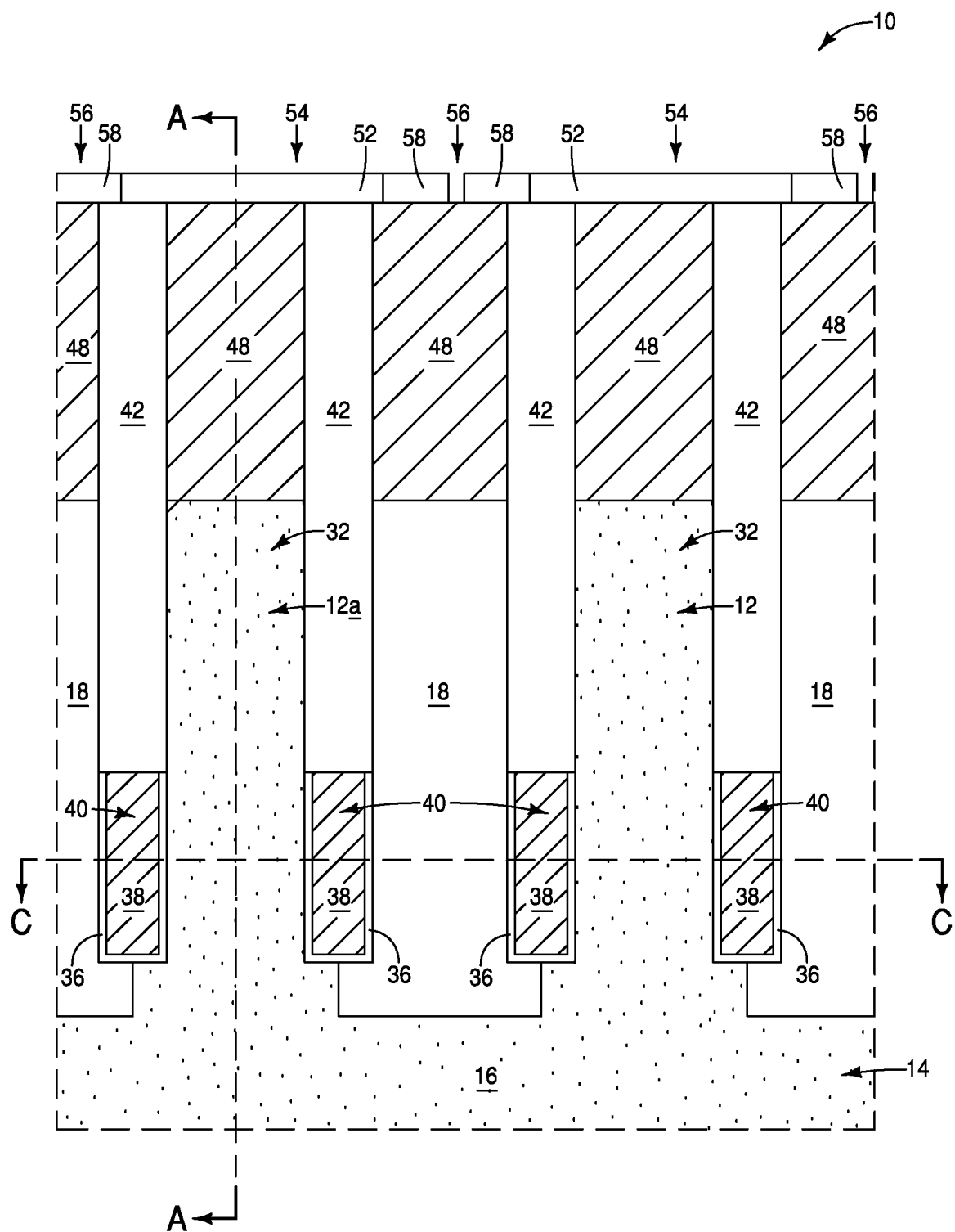

Referring to FIGS. 7-7B, the trenches 56 are lined with sacrificial material 58 to narrow the trenches 56. The sacrificial material 58 may be formed to line the trenches 56 utilizing any suitable processing. For instance, in some embodiments a film of the sacrificial material 58 may be formed to extend over the sacrificial material 52 and within the trenches 56, and then such film may be anisotropically etched to leave the liners of material 58 within the trenches 56.

The sacrificial material 58 may comprise any suitable composition(s); and in some embodiments may comprise one or more of AlO, SiON and SiCN, where the chemical formulas indicate primary constituents rather than specific stoichiometries.

The sacrificial materials 52 and 58 may be referred to as first and second sacrificial materials, respectively. In some embodiments, such first and second sacrificial materials may comprise different compositions relative to one another. For instance, the first sacrificial material 52 may comprise aluminum oxide, and the second sacrificial material may comprise one or both of SiON and SiCN, where the chemical formulas indicate primary constituents rather than specific stoichiometries.

Figure 8:
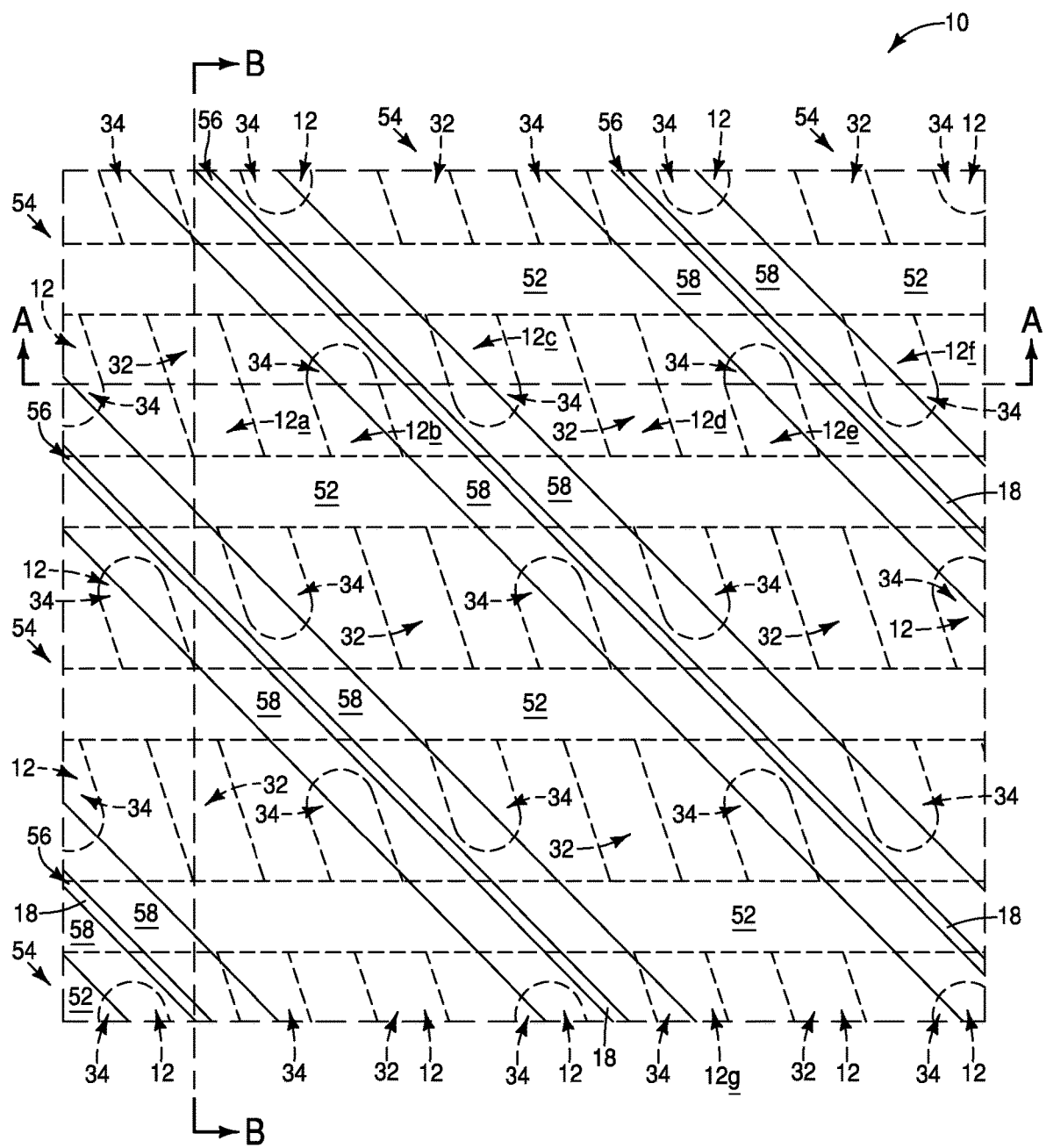
FIGS. 8-8B are diagrammatic views of a region of the example integrated assembly of FIGS. 1-1C shown at an example process step following that of FIGS. 7-7B.
Figure 8A:
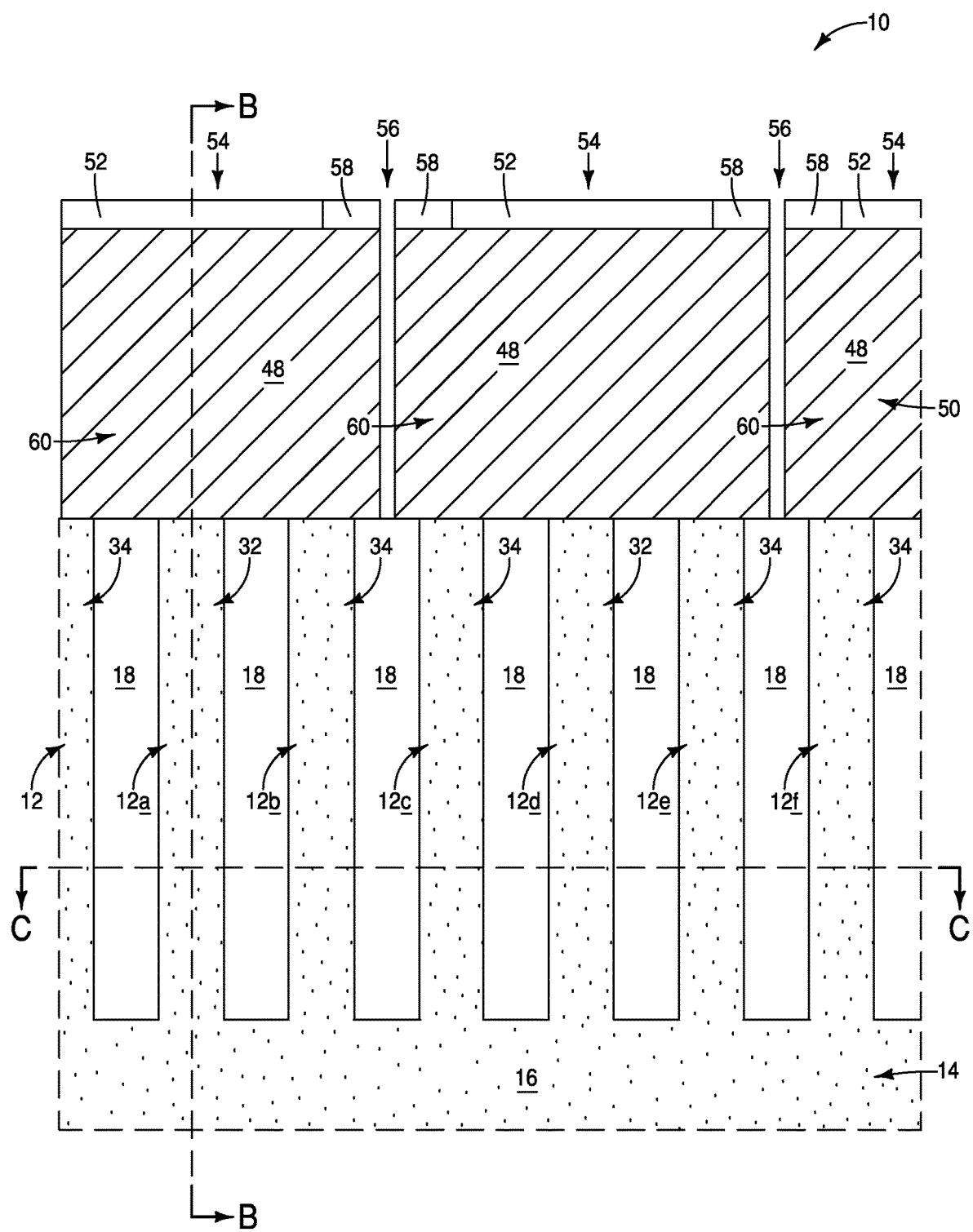
Figure 8B:
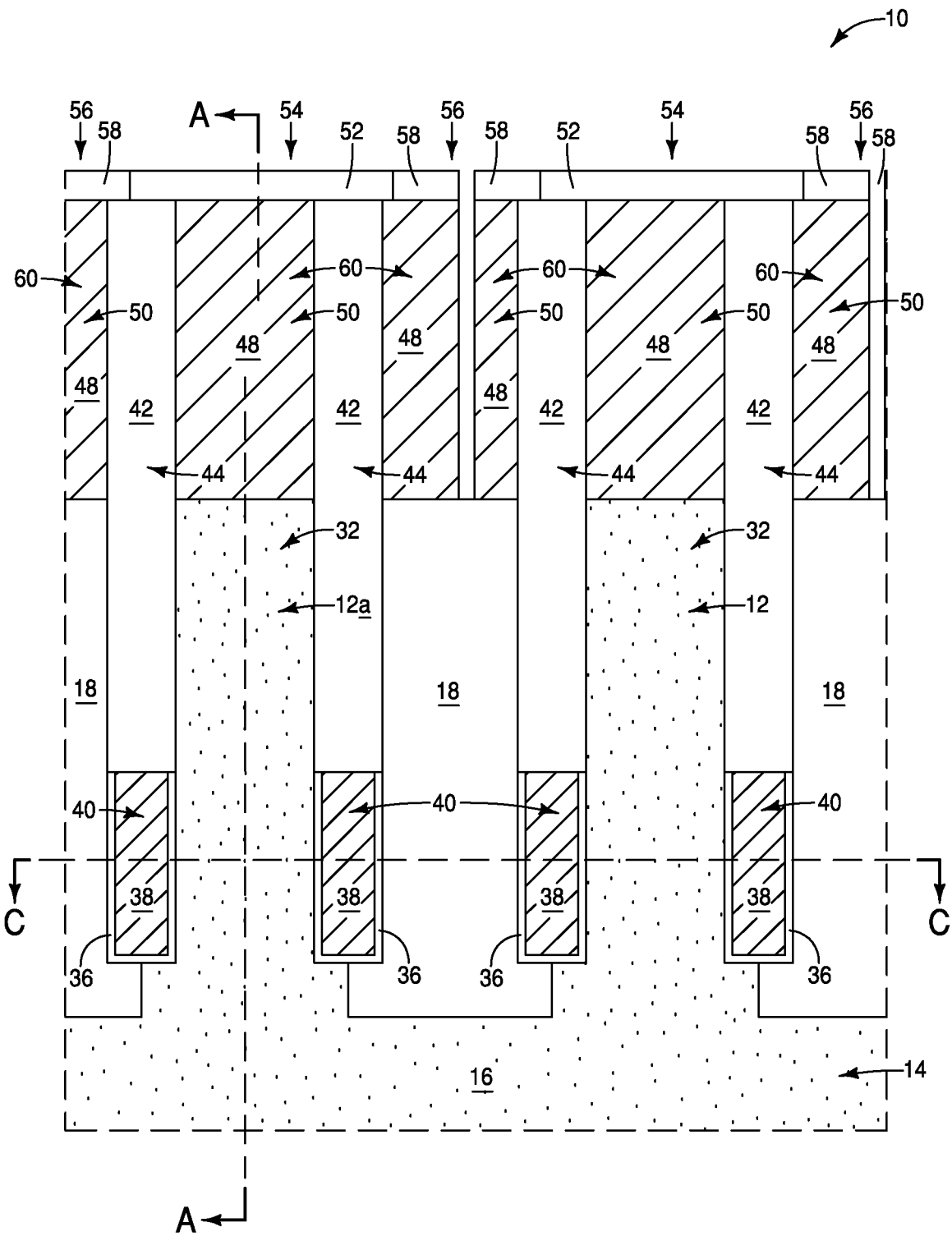

Referring to FIGS. 8-8B, the narrowed trenches 56 are extended through the first and second rails 44 and 50. The extended trenches 56 pattern the second rails 50 into conductive blocks 60.

Figure 9:
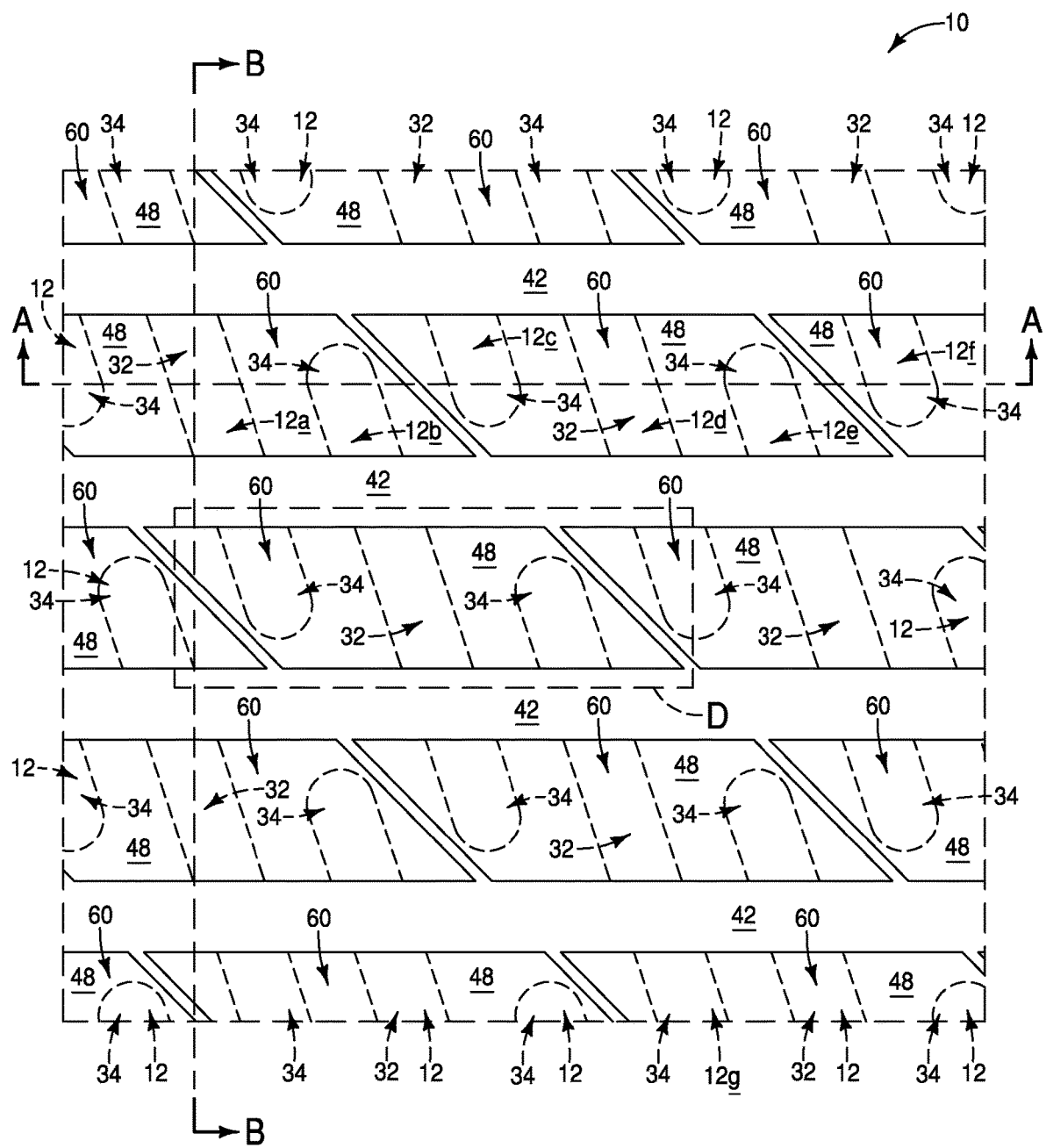
FIGS. 9-9B are diagrammatic views of a region of the example integrated assembly of FIGS. 1-1C shown at an example process step following that of FIGS. 8-8B.
Figure 9A:
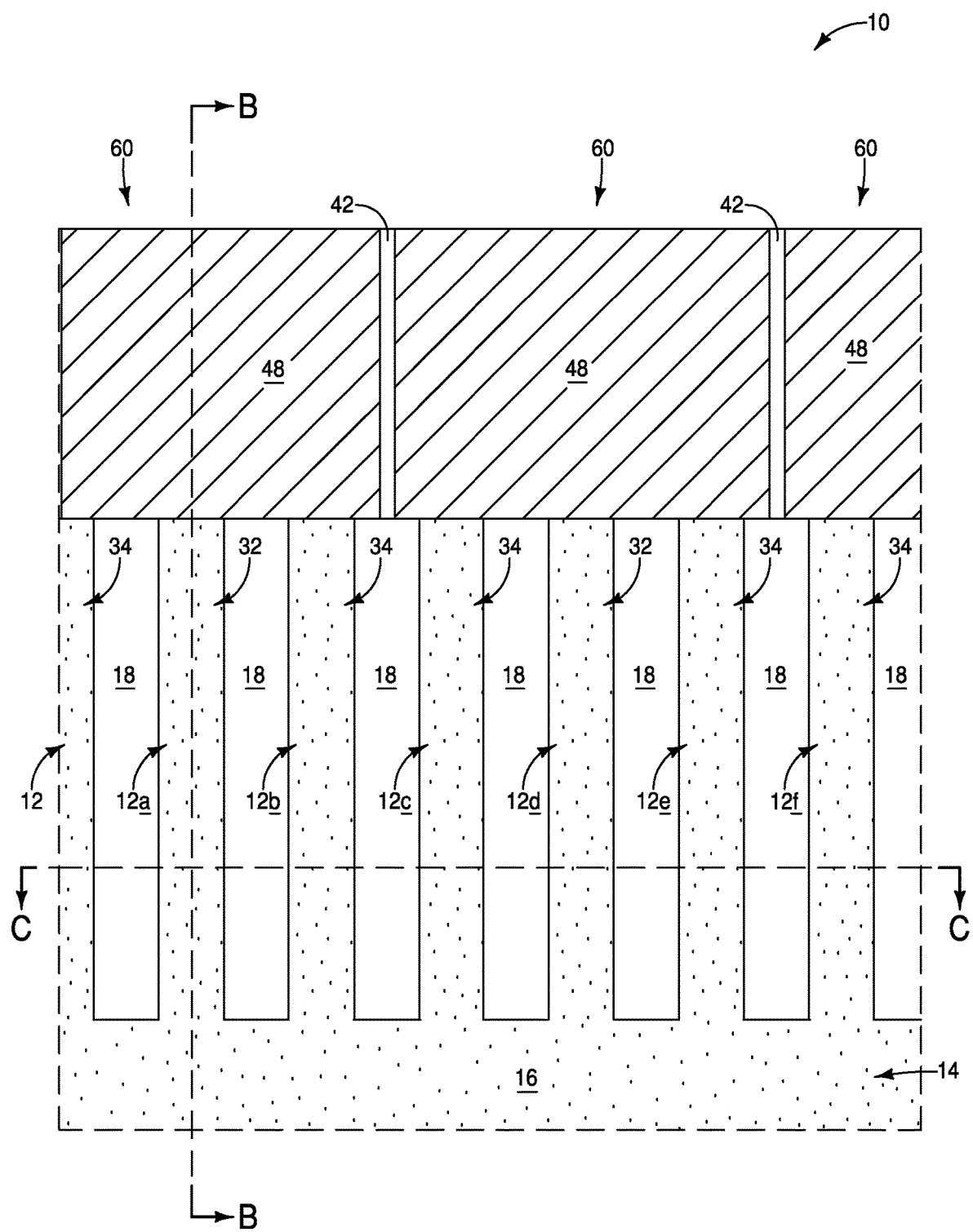
Figure 9B:
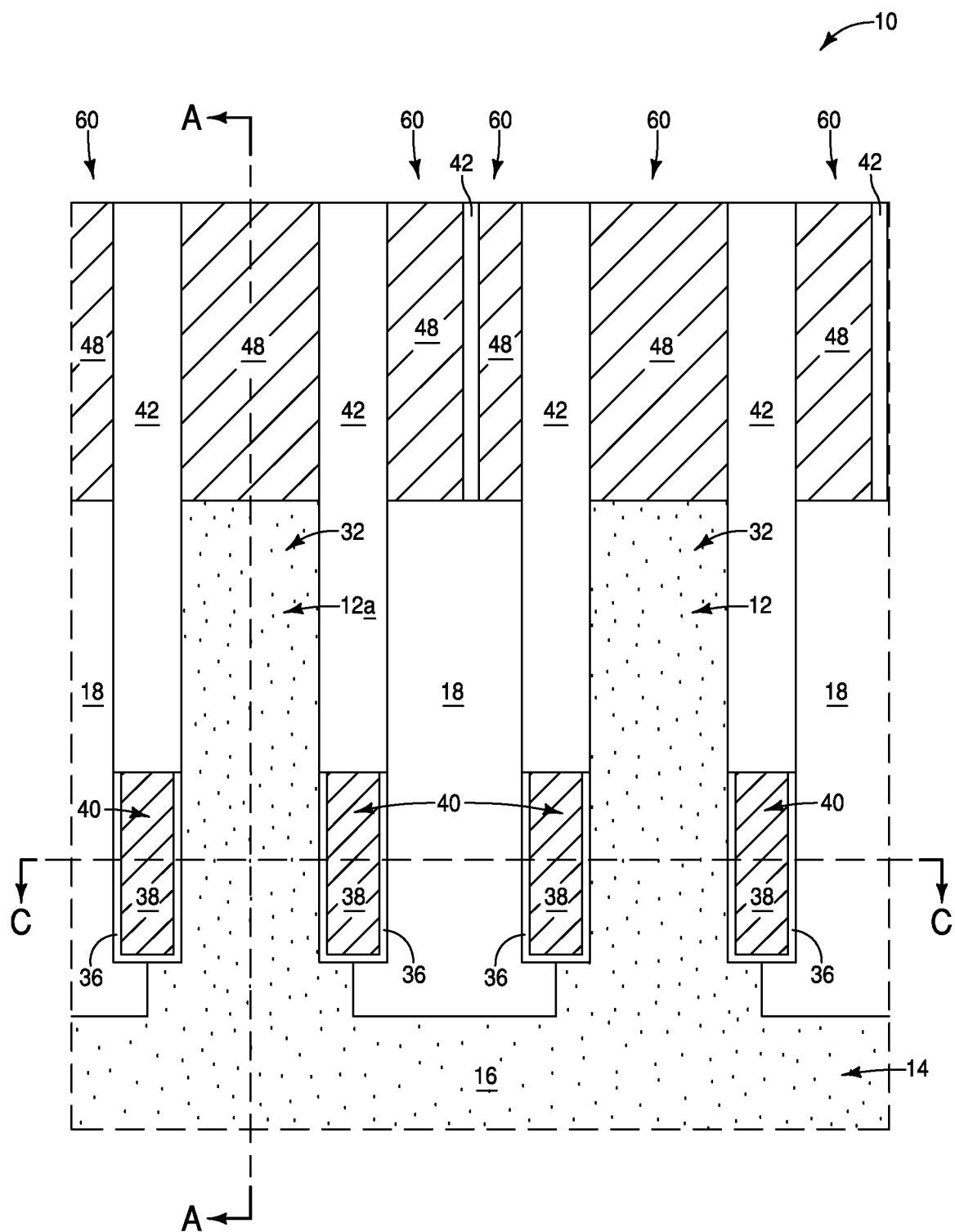

Referring to FIGS. 9-9B, the narrowed trenches 56 (FIGS. 8-8B) are filled with insulative material 42, and subsequently the sacrificial materials 52 and 58 (FIGS. 8-8B) are removed. In some embodiments, the insulative material provided within the narrowed trenches 56 may be referred to as a second insulative material to distinguish it from the first insulative material 42 of the rails 44. Such second insulative material may be a same composition as the first insulative material (as shown), or may be a different composition relative to the first insulative material. In some embodiments, the first insulative material of the rails 44 and the second insulative material formed within the narrowed trenches 56 may both comprise, consist essentially of, or consist of silicon nitride. In some embodiments, the insulative material 42 may be considered to fill gaps between the patterned blocks 60.

Figure 10:
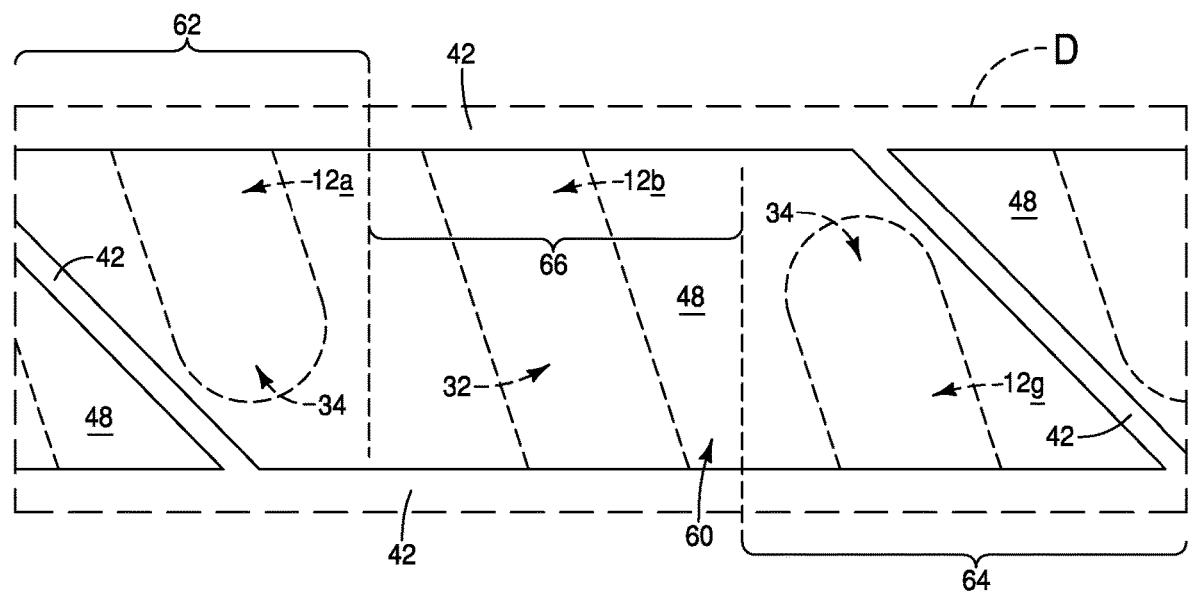
FIG. 10 is an enlarged view of a region indicated as "D" in FIG. 9.

Each of the conductive blocks 60 is laterally surrounded by the insulative material 42. A region "D" of FIG. 9 is enlarged and illustrated in FIG. 10 in order to illustrate a configuration of a representative one of the conductive blocks 60, and to show the relationship of such block relative to underlying contact regions 32 and 34. Specifically, the block 60 is over a set of three of the contact regions 32 and 34; with such set including a pair of the storage-element-contact-regions 34, and one of the digit-line-contact-regions 32 between the storage-element-contact-regions. The block 60 may be considered to comprise a first end region 62 which overlaps one of the storage-element-contact-regions 34; a second end region 64 which overlaps the other of the storage-note-contact-regions 34; and a central region 66 between the first and second end regions 62 and 64, and overlapping the digit-line-contact-region 32. The illustrated conductive block 60 of FIG. 10 is substantially identical to all of the other blocks 60 of FIGS. 9-9B (with the term "substantially identical" meaning identical to within reasonable tolerances of fabrication and measurement). Accordingly, each of the conductive blocks 60 of FIGS. 9-9B is over a set of three contact regions (32 and 34), with each set including two storage-element-contact-regions 34, and a digit-line-contact-region 32 between the storage-element-contact-regions. Notably, each of the contact regions of a set overlapped by a conductive block 60 is part of a different active-region-pillar. For instance, FIG. 10 shows that the illustrated contact regions 32 and 34 are part of active-region-pillars 12a, 12b and 12g.

Figure 11:
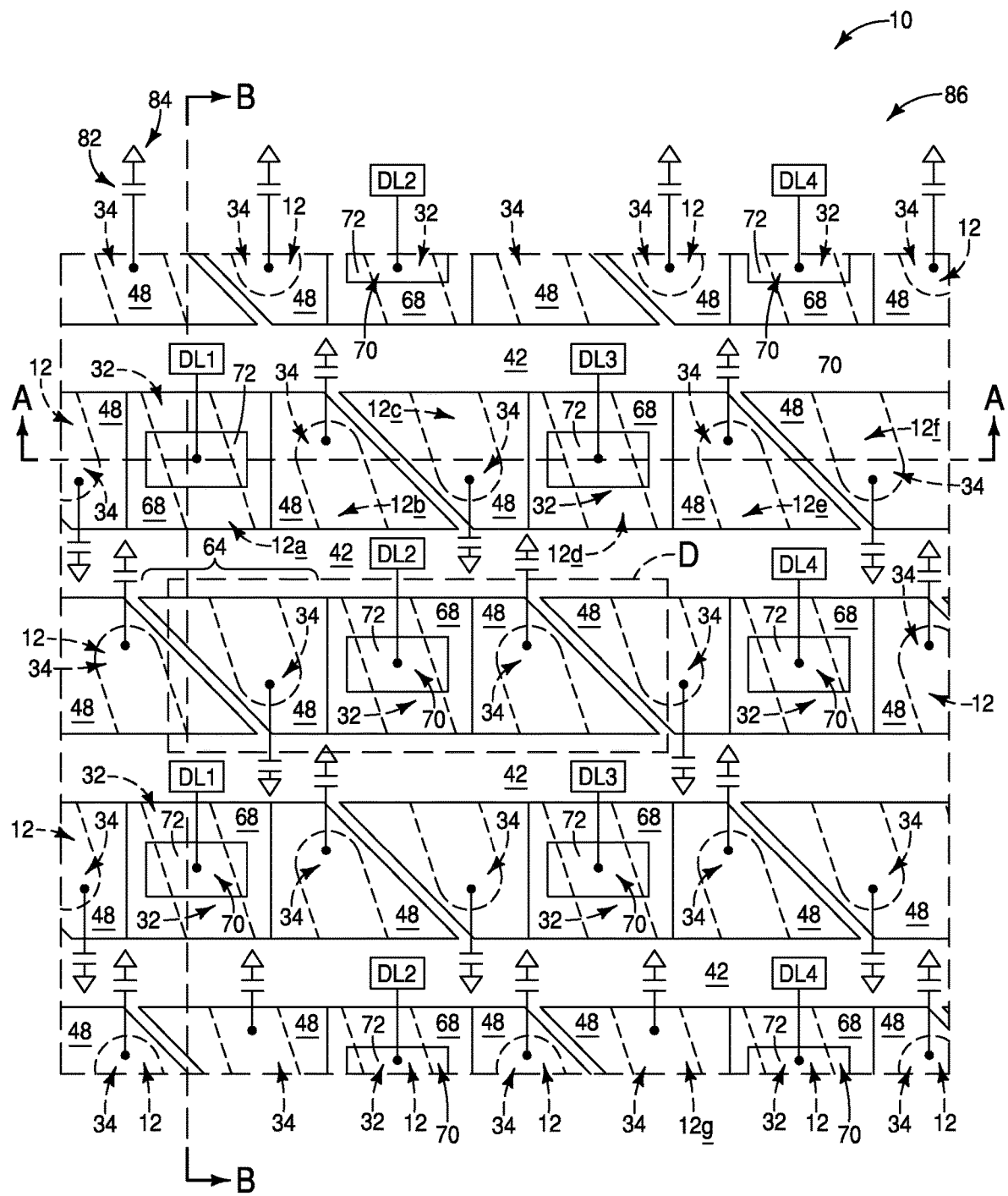
FIGS. 11-11B are diagrammatic views of a region of the example integrated assembly of FIGS. 1-1C shown at an example process step following that of FIGS. 9-9B.
Figure 11A:
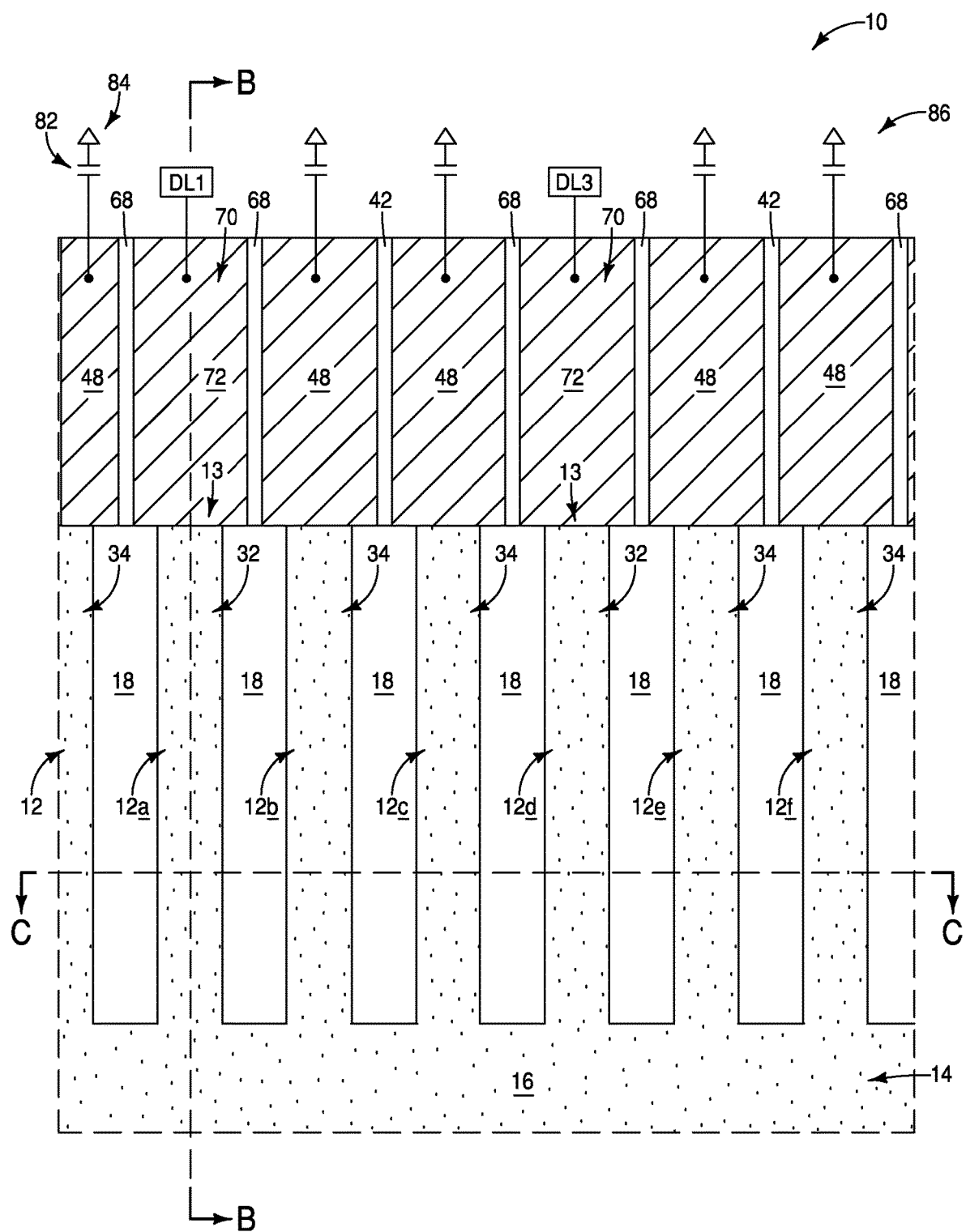
Figure 11B:
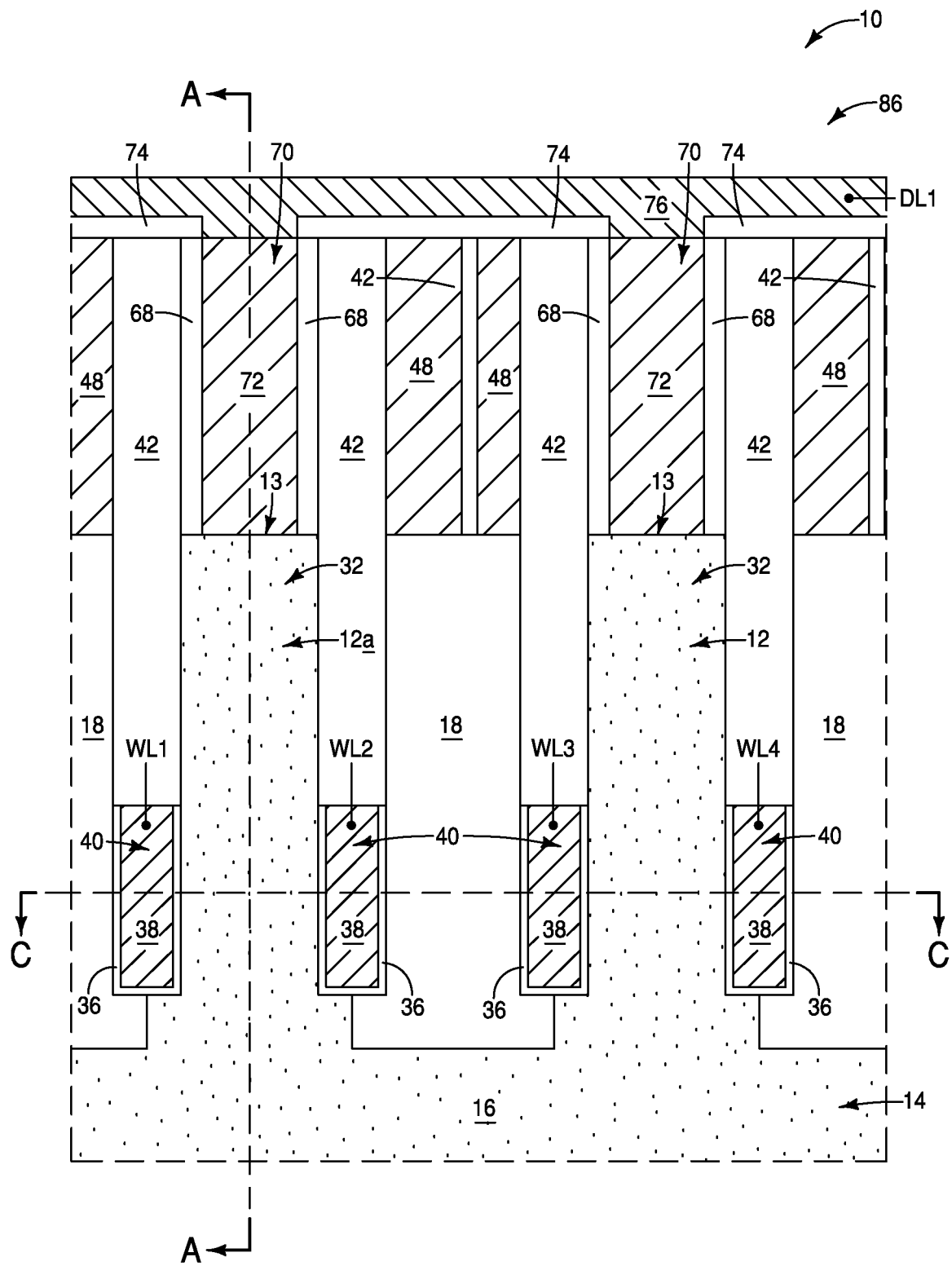

Referring to FIGS. 11-11B, the central regions 66 (FIG. 10) of the conductive blocks 60 (FIGS. 9-9B) are removed and replaced with insulative material 68. The insulative material 68 may comprise any suitable composition(s); and in some embodiments may comprise, consist essentially of, or consist of silicon dioxide.

In some embodiments, the insulative material 68 may be referred to as a third insulative material to distinguish it from the first insulative material 42 and the second insulative material provided within the narrowed trenches 56 (with the narrowed trenches being shown in FIGS. 8-8B, and with the insulative material formed within the narrowed trenches being shown in FIGS. 9-9B). If the first insulative material 42 and the material provided within the narrowed trenches 56 are the same as one another, then the insulative material 68 may be referred to as a second insulative material to distinguish it from the first insulative material 42.

Digit-line-interconnects 70 are formed to extend through the insulative material 68 and to be coupled with the digit-line-contact-regions 32. The interconnects 70 comprise conductive material 72. The conductive material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In the shown embodiment, the conductive material 72 directly contacts the upper surfaces 13 of the digit-line-contact-regions 32.

The illustrated digit-line-interconnects 70 are shown to be square-shaped relative to the top view of FIG. 11. It is to be understood, however, that the digit-line-interconnects may have any suitable shapes; and in some embodiments may be rectangular, circular, elliptical, etc. relative to the top view of FIG. 11.

Digit-lines (DL1-DL4) are coupled with the digit-line-contact-regions through the digit-line-interconnects 70. The digit-lines are diagrammatically illustrated in FIGS. 11 and 11A with schematic indications utilizing boxes to represent the digit-lines in order to simplify the drawings. However, FIG. 11B diagrammatically illustrates the digit-line DL1 as comprising a conductive digit-line-material 76 configured as a line extending across the interconnects 70, and being coupled with the interconnects 70. The conductive material 76 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Insulative material 74 is shown in FIG. 11B as being provided under the conductive digit-line-material 76. The insulative material 74 may comprise any suitable composition(s); and in some embodiments may comprise silicon dioxide.

The digit-lines DL1-DL4 would generally extend along the y-axis direction, and accordingly would extend orthogonally relative to the x-axis direction of the wordlines 40.

Figure 12:
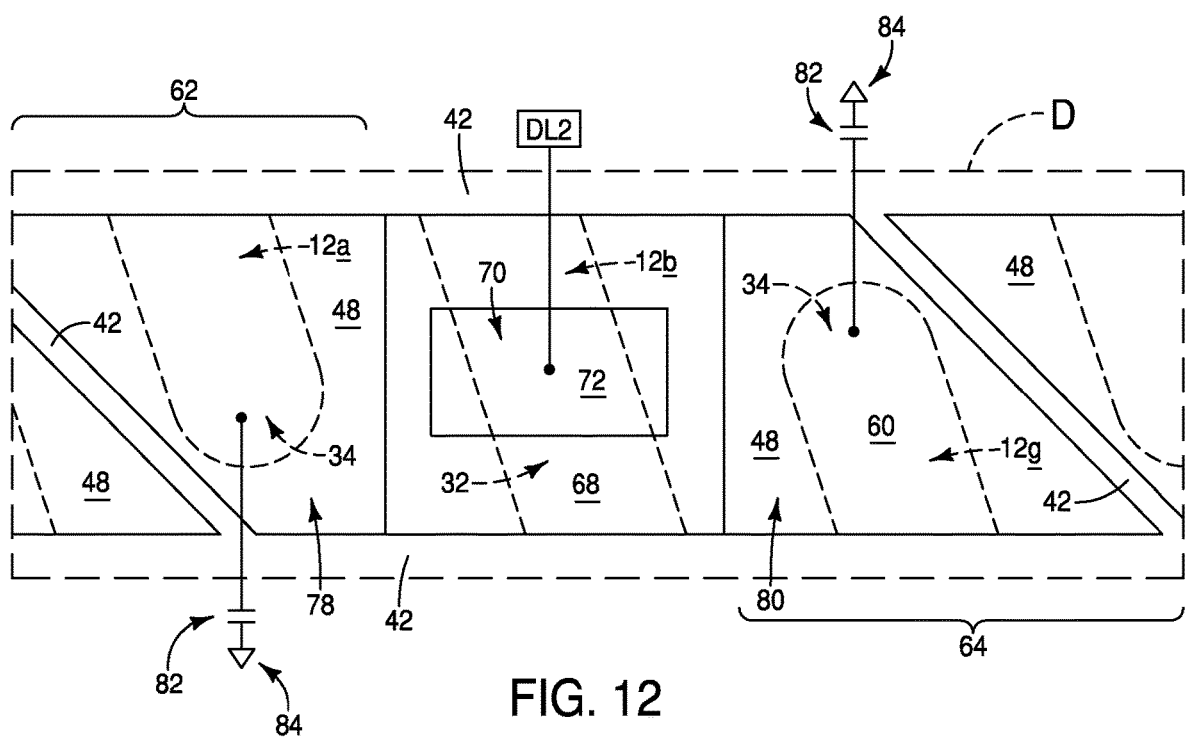
FIG. 12 is an enlarged view of a region indicated as "D" in FIG. 11.

FIG. 12 shows an enlarged view of the region "D" of FIG. 11, and shows that the formation of the insulative material 68 within the illustrated central region 66 has patterned remaining portions 62 and 64 of the conductive material 48 into a first conductive portion 78 over the first storage-element-contact-region associated with pillar 12a, and a second conductive portion 80 over the second storage-element-contact-region associated with pillar 12g. The first and second conductive portions 78 and 80 are spaced from one another by the insulative material 68.

Storage-elements 82 are electrically coupled to the storage-element-contact-regions 34 through the conductive portions 78 and 80 (i.e., through the end regions 62 and 64). In the illustrated embodiment, the storage-elements 82 correspond to capacitors, and are coupled with reference voltages 84. Such reference voltages may be any suitable voltages, including, for example, ground, Vcc/2, etc. In some embodiments, other storage-elements may be utilized instead of the capacitors 82. Any suitable device having two or more detectable states may be utilized as a storage-element; including, for example, devices comprising phase change material, conductive-bridging material, etc.

FIG. 11B indicates that the wordlines 40 may correspond to wordlines WL1-WL4.

Figure 13:
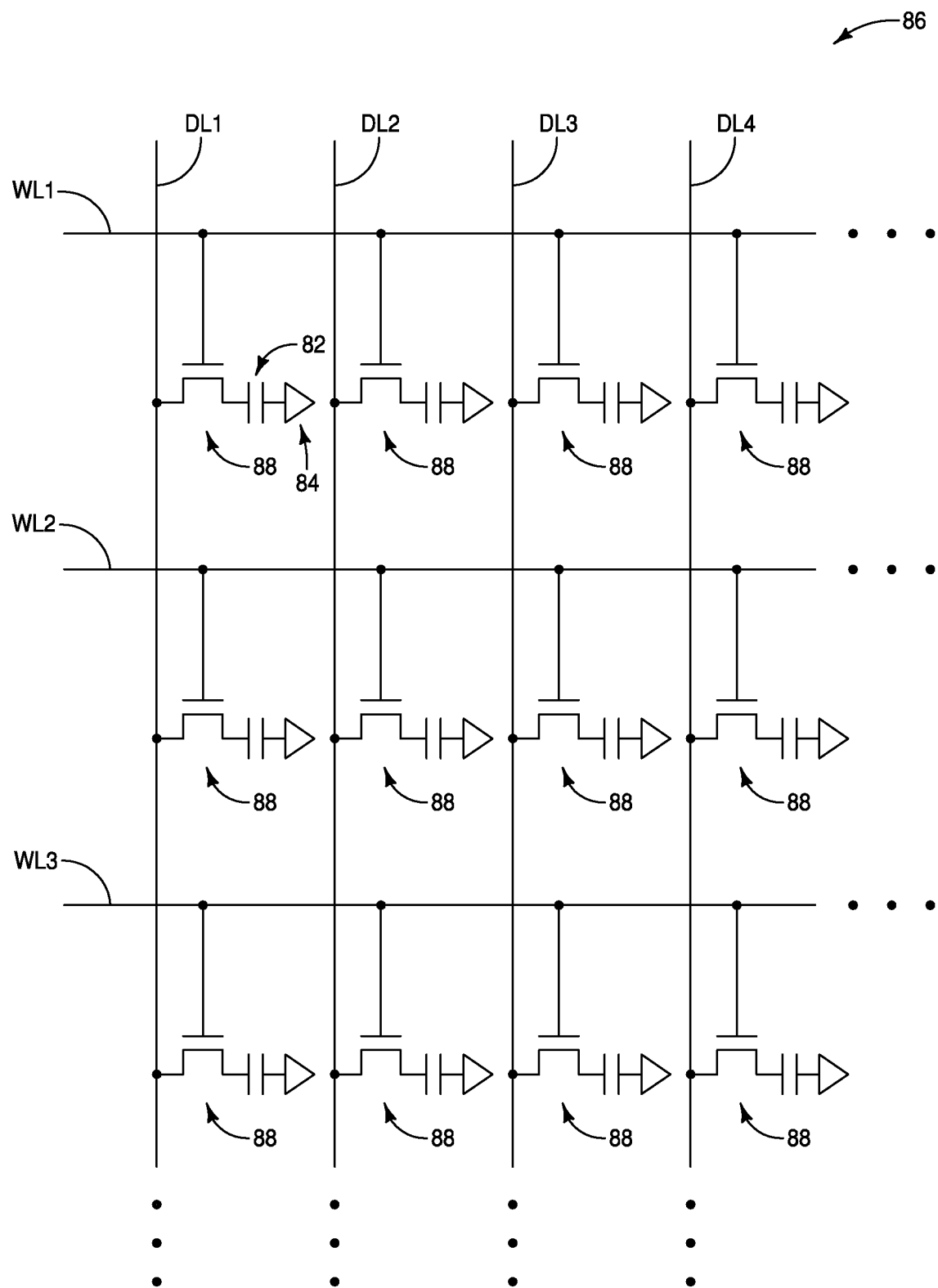
FIG. 13 is a diagrammatic schematic view of a region of an example memory array.

The configuration 10 of FIGS. 11-11B may be considered to comprise example memory cells of a memory array 86. The memory array 86 may have any suitable configuration, and in some embodiments may be a DRAM array. An example DRAM array 86 is schematically illustrated in FIG. 13. The DRAM array 86 includes the digit-lines DL1-DL4, and includes the wordlines WL1-WL4. Memory cells 88 comprise transistors coupled with the capacitors 82. Each of the memory cells 88 is uniquely addressed through the combination of a wordline and a digit-line.

A problem encountered during conventional DRAM fabrication can be that it is difficult to couple storage-elements (e.g., capacitors) with storage-element-contact-regions. The problem is exacerbated with increasing levels of integration. The conductive portions 78 and 80 shown in 12 may simplify the coupling of the storage-elements with the storage-element-contact-regions, and may enable DRAM architectures to be scaled to ever-higher levels of integration.

Figure 14:
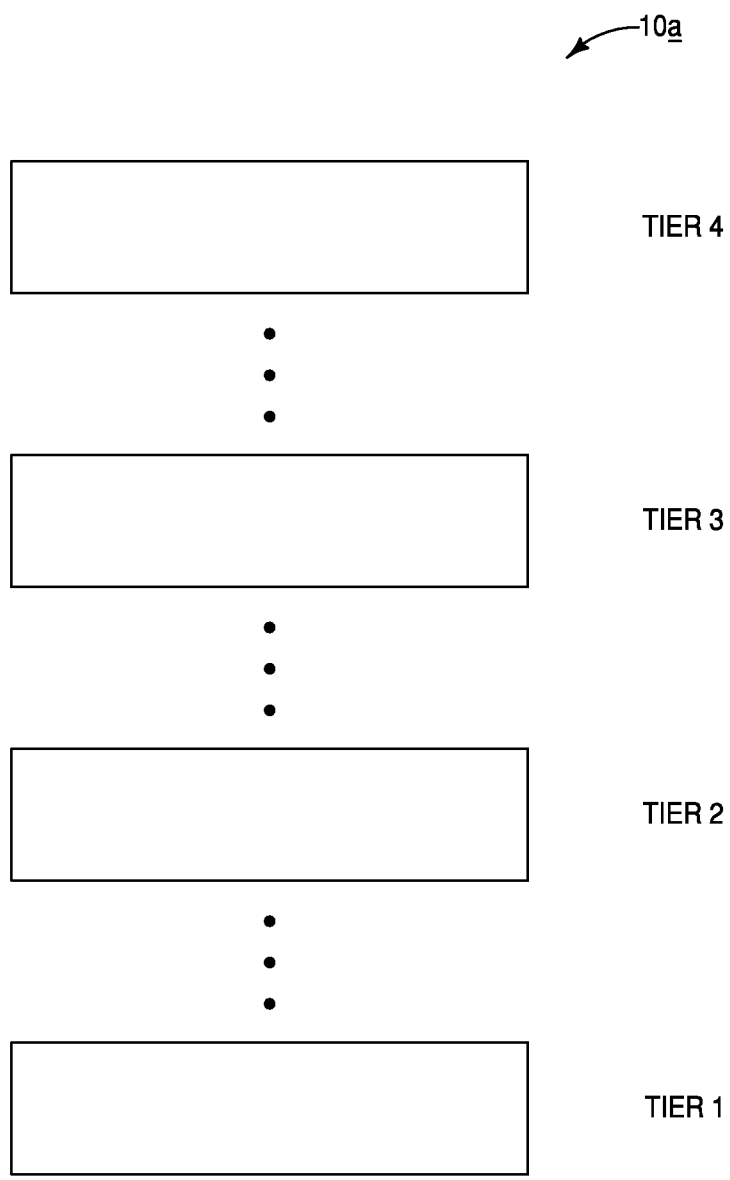
FIG. 14 is a diagrammatic cross-sectional side view of a region of an example assembly comprising stacked tiers.
Figure 15:
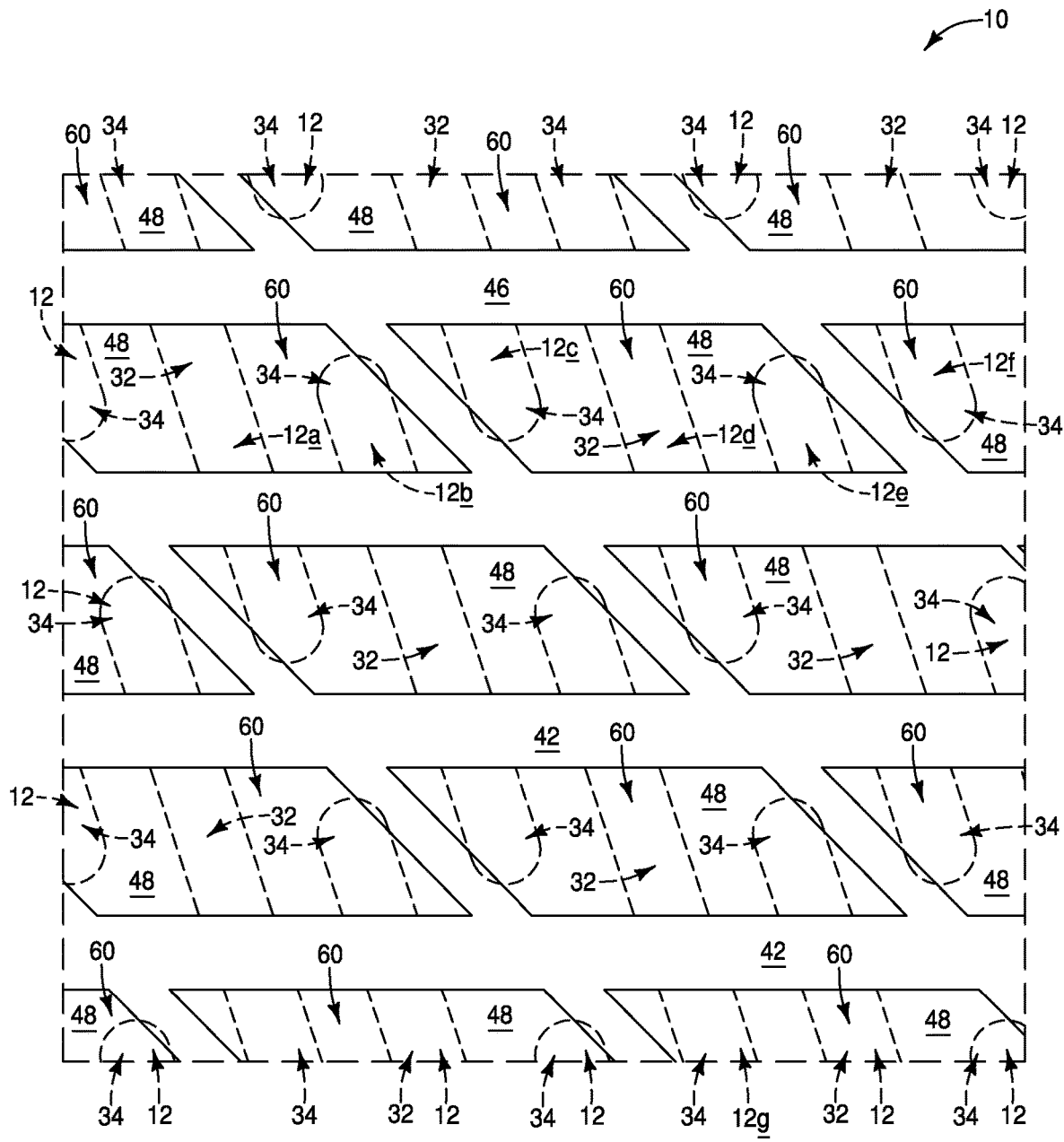
FIG. 15 is a diagrammatic top-down view of a region of the example integrated assembly of FIGS. 1-1C shown at an example process step alternative to that of FIGS. 9-9B.
Figure 15:
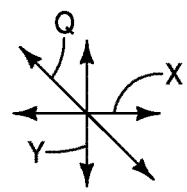

In some embodiments, the memory array 86 may be within a memory tier (i.e., memory deck) which is within a vertically-stacked arrangement of tiers (or decks). For instance, FIG. 14 shows a portion of an integrated assembly 10a comprising a vertically-stacked arrangement of tiers 1-4. The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die. Individual tiers may include control circuitry and/or sensing circuitry (e.g., may include wordline drivers, sense amplifiers, etc.); and/or may include memory arrays, such as, for example, the memory array 86. The memory arrays within the various tiers may be the same as one another (e.g., may all be DRAM arrays), or may be different relative to one another (e.g., some may be DRAM arrays, while others are NAND arrays).

The above-described configuration of FIGS. 9-9B shows the insulative material 46 provided within the narrowed gaps 56 (FIGS. 8-8B) as being configured to not overlap any portions of the storage-element-contact-regions 34. In other embodiments, the insulative material 46 may partially overlap the storage-element-contact-regions 34, with an example of such other embodiments being shown in FIG. 15.

Figure 16:
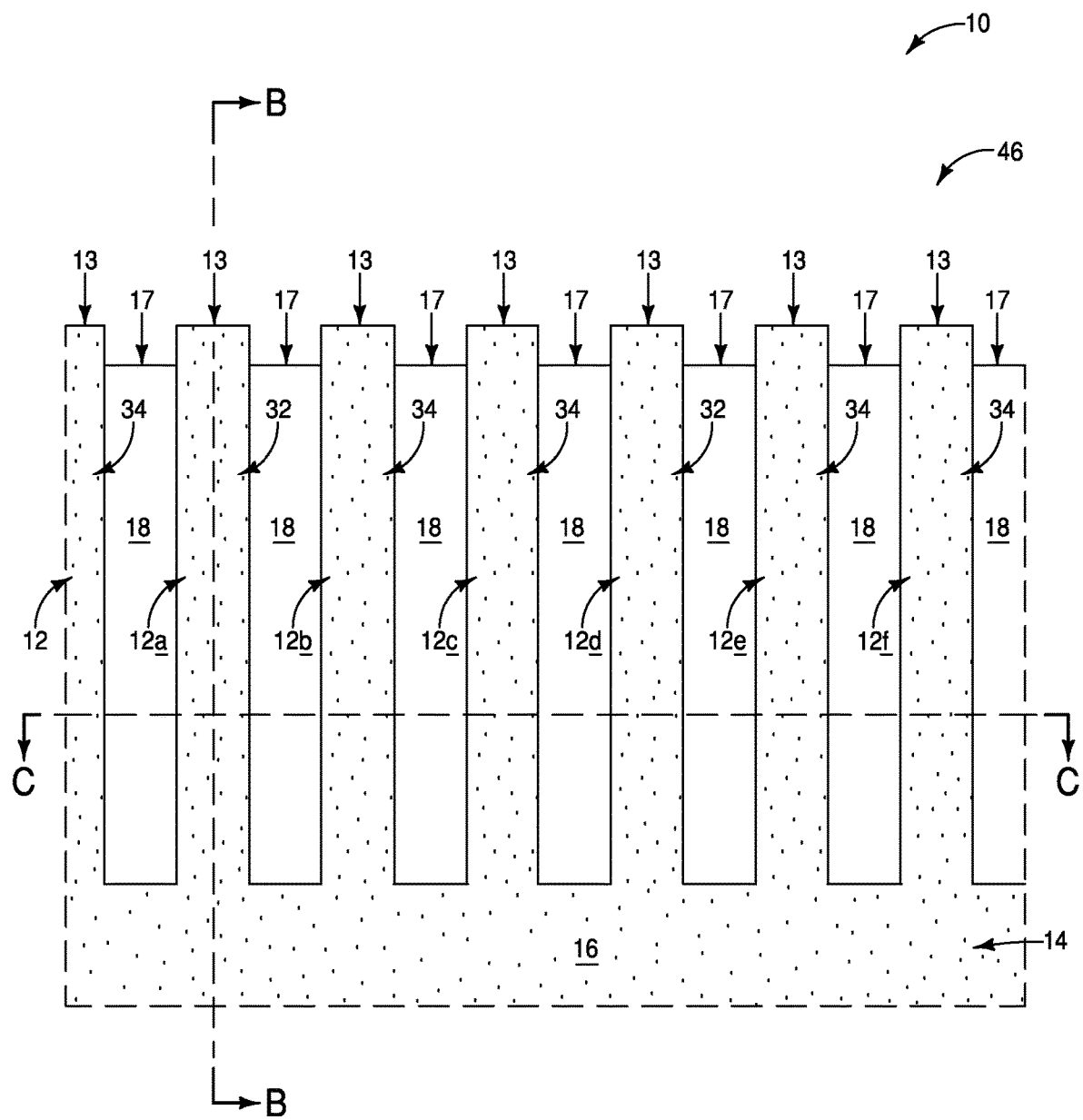
FIGS. 16 and 17 are diagrammatic cross-sectional views along the same cross-section as FIG. 4A, and illustrate alternative configurations which may be formed at the process stage of FIG. 4A.
Figure 17:
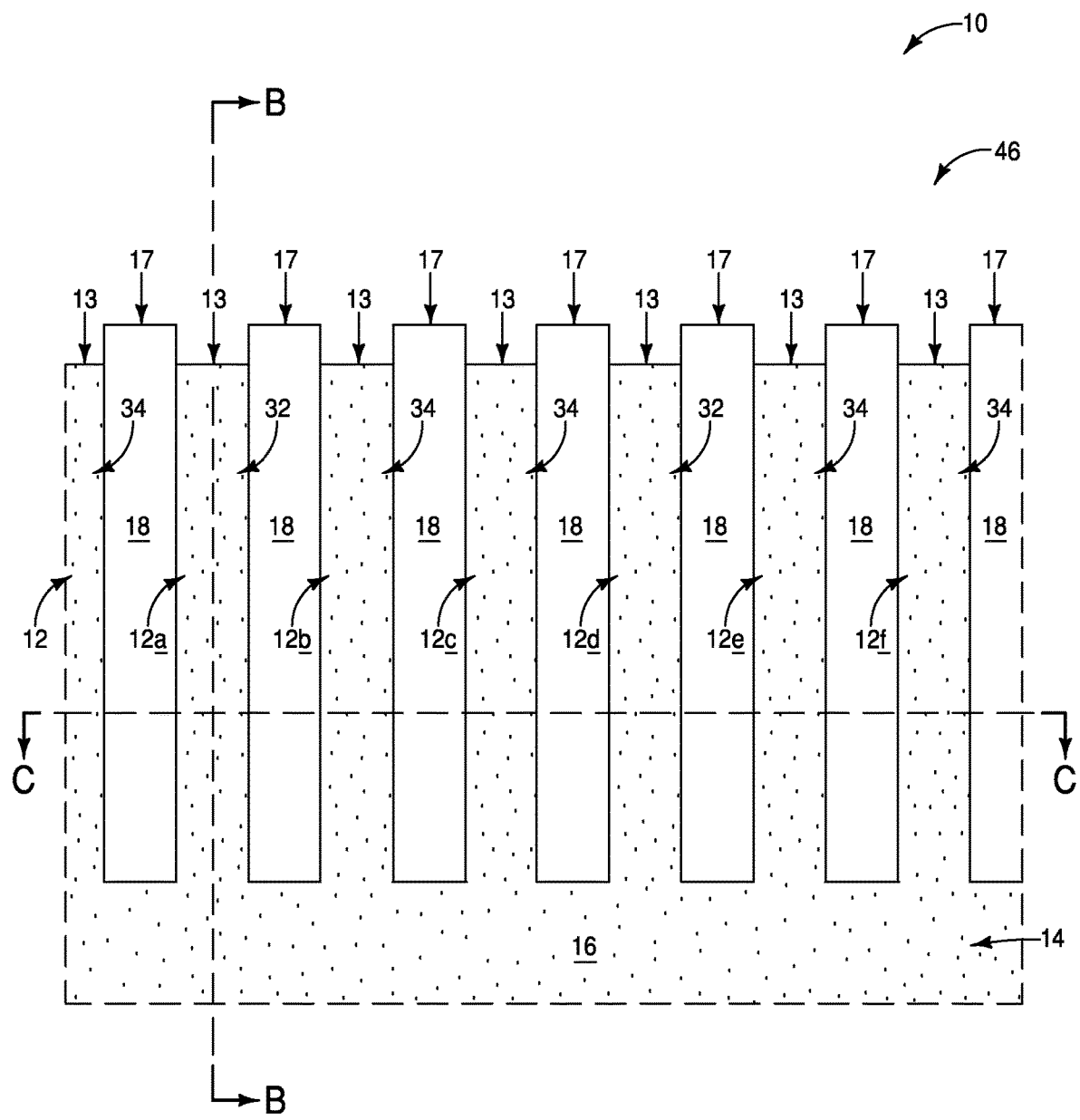

The embodiment of FIG. 4A showed the upper surfaces 13 of the contact regions 32 and 34 being substantially planar with the upper surface 17 of the insulative-support-material 18. In other embodiments, the upper surface 17 of the insulative-support-material may be recessed relative to the upper surfaces 13 of the contact regions 32/34 (i.e., relative to the upper surfaces 13 of the active regions 12) as shown in FIG. 16, or the upper surfaces 13 of the contact regions 32/34 may be recessed relative to the upper surface 17 of the insulative-support-material 18 as shown in FIG. 17.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A construction is provided to have active-region-pillars. Each of the active-region-pillars has an upper portion subdivided amongst three contact regions; with the three contact regions being two storage-element-contact-regions and a digit-line-contact-region. Conductive blocks are formed over the construction. Each of the conductive blocks is over a set of three of the contact regions. Each set includes a pair of the storage-element-contact-regions and one of the digit-line-contact-regions between said pair of the storage-element-contact-regions. The three of the contact regions of each set are associated with a different active-region-pillars relative to one another. Each of the conductive blocks is entirely laterally surrounded by first insulative material. Central regions of the conductive blocks are removed to split each of the conductive blocks into a first conductive portion over one of the storage-element-contact-regions and a second conductive portion over another of the storage-element-contact-regions. Second insulative material is formed between the first and second conductive portions. Digit-line-interconnects are formed which extend through the second insulative material to couple with the digit-line-contact-regions. Digit-lines are formed which are coupled with the digit-line-interconnects. Storage-elements are formed which are coupled with storage-element-contact-regions through the first and second conductive portions.

Some embodiments include a method of forming an integrated assembly. A construction is provided to have active-region-pillars. Each of the active-region-pillars has an upper portion subdivided amongst three contact regions. Said three contact regions are two storage-element-contact-regions and a digit-line-contact-region. First rails are formed over the construction and extend along a first direction. The first rails are spaced from one another by intervening gaps. The first rails comprise first insulative material. Conductive material is formed within the intervening gaps and is coupled with the storage-element-contact-regions and the digit-line-contact-regions. The conductive material forms second rails which alternate with the first rails along a second direction which is orthogonal to the first direction. The second rails are patterned into spaced-apart conductive blocks. Each of the conductive blocks is over a set of three of the contact regions. Each set includes a pair of the storage-element-contact-regions and one of the digit-line-contact-regions between said pair of the storage-element-contact-regions. Each of the conductive blocks has a first end region, a second end region, and a central region between the first and second end regions. Second insulative material is formed in spaces between the spaced-apart conductive blocks. Central regions of the conductive blocks are replaced with third insulative material. Digit-line-interconnects are formed to extend through the third insulative material, and to couple with the digit-line-contact-regions. Digit-lines are formed to extend along the second direction, and are coupled with the digit-line-interconnects. Storage-elements are coupled with the first and second end regions of each of the conductive blocks.

Some embodiments include a method of forming an integrated assembly. A construction is provided to have active-region-pillars extending upwardly from a base. Wordlines are formed to cut through the active-region-pillars, and to subdivide upper portions of each of the active-regionpillars into three contact regions. The three contact regions include two storage-element-contact-regions and a digit-line-contact-region. The wordlines extend along a first direction. First rails are formed over the wordlines, and extend upwardly from the wordlines. The first rails are in one-to-one correspondence with the wordlines, and extend along the first direction. The first rails are spaced from one another by intervening gaps. Upper surfaces of the storage-element-contact-regions and the digit-line-contact-regions are exposed along bottom regions of the intervening gaps. The first rails comprise first insulative material. Conductive material is formed within the intervening gaps, and is directly against the upper surfaces of the storage-element-contact-regions and the digit-line-contact-regions. The conductive material forms second rails which alternate with the first rails along a second direction which is orthogonal to the first direction. Third rails are formed to extend along a third direction which crosses the first and second directions. The third rails pattern the second rails into conductive blocks. The third rails comprise second insulative material. Each of the conductive blocks is over a set of three of the contact regions. Each set includes a pair of the storage-element-contact-regions and one of the digit-line-contact-regions between said pair of the storage-element-contact-regions. Each of the conductive blocks has a first end region, a second end region, and a central region between the first and second end regions. The central regions of the conductive blocks are replaced with third insulative material. Digit-line-interconnects are formed to extend through the third insulative material to couple with the digit-line-contact-regions. Digit-lines are formed to extend along the second direction, and are coupled with the digit-line-interconnects. Storage-elements are coupled with the first and second end regions of each of the conductive blocks.

Some embodiments include a method of forming an integrated assembly. A construction is provided to have active-region-pillars extending upwardly from a base. Wordlines are formed to cut through the active-region-pillars, and to subdivide upper portions of each of the active-region-pillars into three contact regions. The three contact regions include two storage-element-contact-regions and a digit-line-contact-region. The wordlines extend along a first direction. First rails are formed over the wordlines, and extend upwardly from the wordlines. The first rails are in one-to-one correspondence with the wordlines and extend along the first direction. The first rails are spaced from one another by intervening gaps. The first rails comprise first insulative material. Conductive material is formed within the intervening gaps and is coupled with the storage-element-contact-regions and the digit-line-contact-regions. The conductive material forms second rails which alternate with the first rails along a second direction which is orthogonal to the first direction. Patterned lines of first sacrificial material are formed over the first and second rails. The patterned lines extend along a third direction which crosses the first and second directions. The patterned lines of first sacrificial material are spaced from one another by trenches. Bottoms of the trenches comprise upper surfaces of the first and second rails. The trenches are lined with second sacrificial material to narrow the trenches. The narrowed trenches are extended through the first and second rails. The extended narrowed trenches pattern the second rails into conductive blocks. Each of the conductive blocks is over a set of three of the contact regions. Each set includes a pair of the storage-element-contact-regions and one of the digit-line-contact-regions between said pair of the storage-element-contact-regions. Each of the conductive blocks has a first end region, a second end region, and a central region between the first and second end regions. The extended narrowed trenches are filled with second insulative material to form third rails within the extending narrowed trenches. The first and second sacrificial materials are removed. The central regions of the conductive blocks are replaced with third insulative material. Digit-line-interconnects are formed to extend through the third insulative material to couple with the digit-line-contact-regions. Digit-lines are formed to extend along the second direction and are coupled with the digit-line-interconnects. Storage-elements are coupled with the first and second end regions of each of the conductive blocks.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   providing a construction having active-region-pillars; each of the active-region-pillars having an upper portion subdivided amongst three contact regions; said three contact regions being two storage-element-contact-regions and a digit-line-contact-region;
   forming conductive blocks over the construction; each of the conductive blocks being over a set of three of the contact regions; each set including a pair of the storage-element-contact-regions and one of the digit-line-contact-regions between said pair of the storage-element-contact-regions; said three of the contact regions of each set being associated with a different active-region-pillar relative to one another; each of the conductive blocks being entirely laterally surrounded by first insulative material;
   removing central regions of the conductive blocks to split each of the conductive blocks into a first conductive portion over one of the storage-element-contact-regions and a second conductive portion over another of the storage-element-contact-regions;
   forming second insulative material between the first and second conductive portions;
   forming digit-line-interconnects which extend through the second insulative material to couple with the digit-line-contact-regions;
   forming digit-lines which are coupled with the digit-line-interconnects; and
   forming storage-elements which are coupled with storage-element-contact-regions through the first and second conductive portions.

2. The method of claim 1 wherein the storage-elements are capacitors.

3. The method of claim 1 wherein the first insulative material comprises silicon nitride.

4. The method of claim 1 wherein the second insulative material comprises silicon dioxide.

5. The method of claim 1 wherein the conductive blocks comprise conductively-doped semiconductor material.

6. The method of claim 1 wherein the conductive blocks comprise n-type silicon.

7. The method of claim 1 wherein the conductive blocks comprise metal-containing material.

8. A method of forming an integrated assembly, comprising:
   providing a construction having active-region-pillars; each of the active-region-pillars having an upper portion subdivided amongst three contact regions; said three contact regions being two storage-element-contact-regions and a digit-line-contact-region;
   forming first rails over the construction and extending along a first direction; the first rails being spaced from one another by intervening gaps; the first rails comprising first insulative material;
   forming conductive material within the intervening gaps and coupled with the storage-element-contact-regions and the digit-line-contact-regions; the conductive material forming second rails which alternate with the first rails along a second direction which is orthogonal to the first direction;
   patterning the second rails into spaced-apart conductive blocks; each of the conductive blocks being over a set of three of the contact regions; each set including a pair of the storage-element-contact-regions and one of the digit-line-contact-regions between said pair of the storage-element-contact-regions; each of the conductive blocks having a first end region, a second end region, and a central region between the first and second end regions;
   forming second insulative material in spaces between the spaced-apart conductive blocks;
   replacing the central regions of the conductive blocks with third insulative material;
   forming digit-line-interconnects which extend through the third insulative material to couple with the digit-line-contact-regions;
   forming digit-lines which extend along the second direction and which are coupled with the digit-line-interconnects; and
   coupling storage-elements with the first and second end regions of each of the conductive blocks.

9. The method of claim 8 wherein the first and second insulative materials are a same composition as one another.

10. The method of claim 9 wherein the first and second insulative materials comprise silicon nitride.

11. The method of claim 8 wherein the conductive material comprises conductively-doped semiconductor material.

12. The method of claim 8 wherein the conductive material comprises n-type silicon.

13. The method of claim 8 wherein the conductive material comprises metal-containing material.

14. A method of forming an integrated assembly, comprising:
   providing a construction having active-region-pillars extending upwardly from a base;
   forming wordlines which cut through the active-region-pillars, and which subdivide upper portions of each of the active-region-pillars into three contact regions; said three contact regions including two storage-element-contact-regions and a digit-line-contact-region; the wordlines extending along a first direction;
   forming first rails over the wordlines and extending upwardly from the wordlines; the first rails being in one-to-one correspondence with the wordlines and extending along the first direction; the first rails being spaced from one another by intervening gaps; upper surfaces of the storage-element-contact-regions and the digit-line-contact-regions being exposed along bottom regions of the intervening gaps; the first rails comprising first insulative material;
   forming conductive material within the intervening gaps and directly against the upper surfaces of the storage-element-contact-regions and the digit-line-contact-regions; the conductive material forming second rails which alternate with the first rails along a second direction which is orthogonal to the first direction;
   forming third rails extending along a third direction which crosses the first and second directions; the third rails patterning the second rails into conductive blocks; the third rails comprising second insulative material; each of the conductive blocks being over a set of three of the contact regions; each set including a pair of the storage-element-contact-regions and one of the digit-line-contact-regions between said pair of the storage-element-contact-regions; each of the conductive blocks having a first end region, a second end region, and a central region between the first and second end regions;
   replacing the central regions of the conductive blocks with third insulative material;
   forming digit-line-interconnects which extend through the third insulative material to couple with the digit-line-contact-regions;
   forming digit-lines which extend along the second direction and which are coupled with the digit-line-interconnects; and
   coupling storage-elements with the first and second end regions of each of the conductive blocks.

15. The method of claim 14 wherein the bottoms of the intervening gaps include the upper surfaces of the storage-element-contact-regions and the digit-line-contact-regions, and include an upper surface of an insulative-support-material between the storage-element-contact-regions and the digit-line-contact-regions; and wherein the upper surface of the insulative-support-material is recessed relative to the upper surfaces of the storage-element-contact-regions and the digit-line-contact-regions.

16. The method of claim 14 wherein the bottoms of the intervening gaps include the upper surfaces of the storage-element-contact-regions and the digit-line-contact-regions, and include an upper surface of an insulative-support-material between the storage-element-contact-regions and the digit-line-contact-regions; and wherein the upper surfaces of the storage-element-contact-regions and the digit-line-contact-regions are recessed relative to the upper surface of the insulative-support-material.

17. The method of claim 14 wherein the first and second insulative materials are a same composition as one another.

18. The method of claim 14 wherein the active-region-pillars and the base comprise a semiconductor material.

19. The method of claim 18 wherein the semiconductor material includes one or both of silicon and germanium.

20. The method of claim 14 wherein the conductive material comprises conductively-doped semiconductor material.

21. The method of claim 14 wherein the conductive material comprises n-type silicon.

22. The method of claim 14 wherein the conductive material comprises metal-containing material.

23. A method of forming an integrated assembly, comprising:
   providing a construction having active-region-pillars extending upwardly from a base;
   forming wordlines which cut through the active-region-pillars, and which subdivide upper portions of each of the active-region-pillars into three contact regions; said three contact regions including two storage-elementcontact-regions and a digit-line-contact-region; the wordlines extending along a first direction;

forming first rails over the wordlines and extending upwardly from the wordlines; the first rails being in one-to-one correspondence with the wordlines and extending along the first direction; the first rails being spaced from one another by intervening gaps; the first rails comprising first insulative material;

forming conductive material within the intervening gaps and coupled with the storage-element-contact-regions and the digit-line-contact-regions; the conductive material forming second rails which alternate with the first rails along a second direction which is orthogonal to the first direction;

forming patterned lines of first sacrificial material over the first and second rails; the patterned lines of first sacrificial material extending along a third direction which crosses the first and second directions; the patterned lines of first sacrificial material being spaced from one another by trenches; bottoms of the trenches comprising upper surfaces of the first and second rails;

lining the trenches with second sacrificial material to narrow the trenches;

extending the narrowed trenches through the first and second rails; the extended narrowed trenches patterning the second rails into conductive blocks; each of the conductive blocks being over a set of three of the contact regions; each set including a pair of the storage-element-contact-regions and one of the digit-line-contact-regions between said pair of the storage-element-contact-regions; each of the conductive blocks having a first end region, a second end region, and a central region between the first and second end regions;

filling the extended narrowed trenches with second insulative material to form third rails within the extending narrowed trenches;

removing the first and second sacrificial materials;

replacing the central regions of the conductive blocks with third insulative material;

forming digit-line-interconnects which extend through the third insulative material to couple with the digit-line-contact-regions;

forming digit-lines which extend along the second direction and which are coupled with the digit-line-interconnects; and coupling storage-elements with the first and second end regions of each of the conductive blocks.

24. The method of claim 23 wherein the first and second insulative materials are a same composition as one another.

25. The method of claim 24 wherein the first and second insulative materials comprise silicon nitride.

26. The method of claim 23 wherein the conductive material comprises conductively-doped semiconductor material.

27. The method of claim 23 wherein the conductive material comprises n-type silicon.

28. The method of claim 23 wherein the conductive material comprises metal-containing material.

29. The method of claim 23 wherein the first sacrificial material comprises one or more of AlO, SiON and SiCN; where the chemical formulas indicate primary constituents rather than specific stoichiometries.

30. The method of claim 23 wherein the second sacrificial material comprises one or more of AlO, SiON and SiCN; where the chemical formulas indicate primary constituents rather than specific stoichiometries.

31. The method of claim 23 wherein the first sacrificial material comprises aluminum oxide; and wherein the second sacrificial material comprises one or both of SiON and SiCN, where the chemical formulas indicate primary constituents rather than specific stoichiometries.

* * * * *